(12) United States Patent
Yang et al.

(10) Patent No.: US 11,217,486 B2
(45) Date of Patent: Jan. 4, 2022

(54) SEMICONDUCTOR DEVICE AND METHOD

(71) Applicant: Taiwan Semiconductor Manufacturing Company, Ltd., Hsinchu (TW)

(72) Inventors: Cheng-Yu Yang, Xihu Township (TW); Feng-Cheng Yang, Zhudong Township (TW); Wei-Yang Lee, Taipei (TW); Yen-Ming Chen, Chu-Pei (TW); Yen-Ting Chen, Taichung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 39 days.

(21) Appl. No.: 16/290,760

(22) Filed: Mar. 1, 2019

(65) Prior Publication Data
US 2020/0135574 A1  Apr. 30, 2020

Related U.S. Application Data

(60) Provisional application No. 62/753,705, filed on Oct. 31, 2018.

(51) Int. Cl.
| | |
|---|---|
| *H01L 21/8234* | (2006.01) |
| *H01L 21/768* | (2006.01) |
| *H01L 27/088* | (2006.01) |
| *H01L 29/66* | (2006.01) |
| *H01L 29/78* | (2006.01) |
| *H01L 29/06* | (2006.01) |
| *H01L 21/308* | (2006.01) |
| *H01L 21/762* | (2006.01) |

(52) U.S. Cl.
CPC .. *H01L 21/823437* (2013.01); *H01L 21/3086* (2013.01); *H01L 21/76224* (2013.01); *H01L 21/76802* (2013.01); *H01L 21/76829* (2013.01); *H01L 21/823431* (2013.01); *H01L 21/823468* (2013.01); *H01L 21/823481* (2013.01); *H01L 27/0886* (2013.01); *H01L 29/0649* (2013.01); *H01L 29/6681* (2013.01); *H01L 29/7851* (2013.01)

(58) Field of Classification Search
CPC ..... H01L 21/823437; H01L 21/823481; H01L 21/823431; H01L 21/76802; H01L 27/0886; H01L 21/76829; H01L 27/0924; H01L 21/823821; H01L 21/823842
See application file for complete search history.

(56) References Cited

U.S. PATENT DOCUMENTS

| | | |
|---|---|---|
| 9,105,490 B2 | 8/2015 | Wang et al. |
| 9,236,267 B2 | 1/2016 | De et al. |
| 9,236,300 B2 | 1/2016 | Liaw |

(Continued)

*Primary Examiner* — Latanya N Crawford Eason
(74) *Attorney, Agent, or Firm* — Slater Matsil, LLP

(57) ABSTRACT

A semiconductor device including a fin field effect transistor (FinFET) with a cut metal gate (CMG) and a method of manufacturing the semiconductor device are described herein. The method includes forming a CMG protective helmet structure at a top portion of a CMG dummy gate plug formed within a semiconductor substrate. The CMG protective helmet structure prevents consumption and damage of a dummy filler material in a CMG region and prevents undesirable polymer/residue byproducts from forming on top surfaces of epitaxial regions of the FinFET during etching processes.

20 Claims, 18 Drawing Sheets

(56) References Cited

U.S. PATENT DOCUMENTS

| | | |
|---|---|---|
| 9,406,804 B2 | 8/2016 | Huang et al. |
| 9,443,769 B2 | 9/2016 | Wang et al. |
| 9,520,482 B1 | 12/2016 | Chang et al. |
| 9,548,366 B1 | 1/2017 | Ho et al. |
| 9,576,814 B2 | 2/2017 | Wu et al. |
| 9,831,183 B2 | 11/2017 | Lin et al. |
| 9,859,386 B2 | 1/2018 | Ho et al. |
| 10,236,213 B1* | 3/2019 | Pandey ............ H01L 21/823481 |
| 10,373,877 B1* | 8/2019 | Wang ................ H01L 21/76224 |
| 2016/0043170 A1* | 2/2016 | Park .................... H01L 27/0886 |
| | | 257/369 |
| 2019/0080998 A1* | 3/2019 | Rastogi ............... H01L 27/0924 |

* cited by examiner

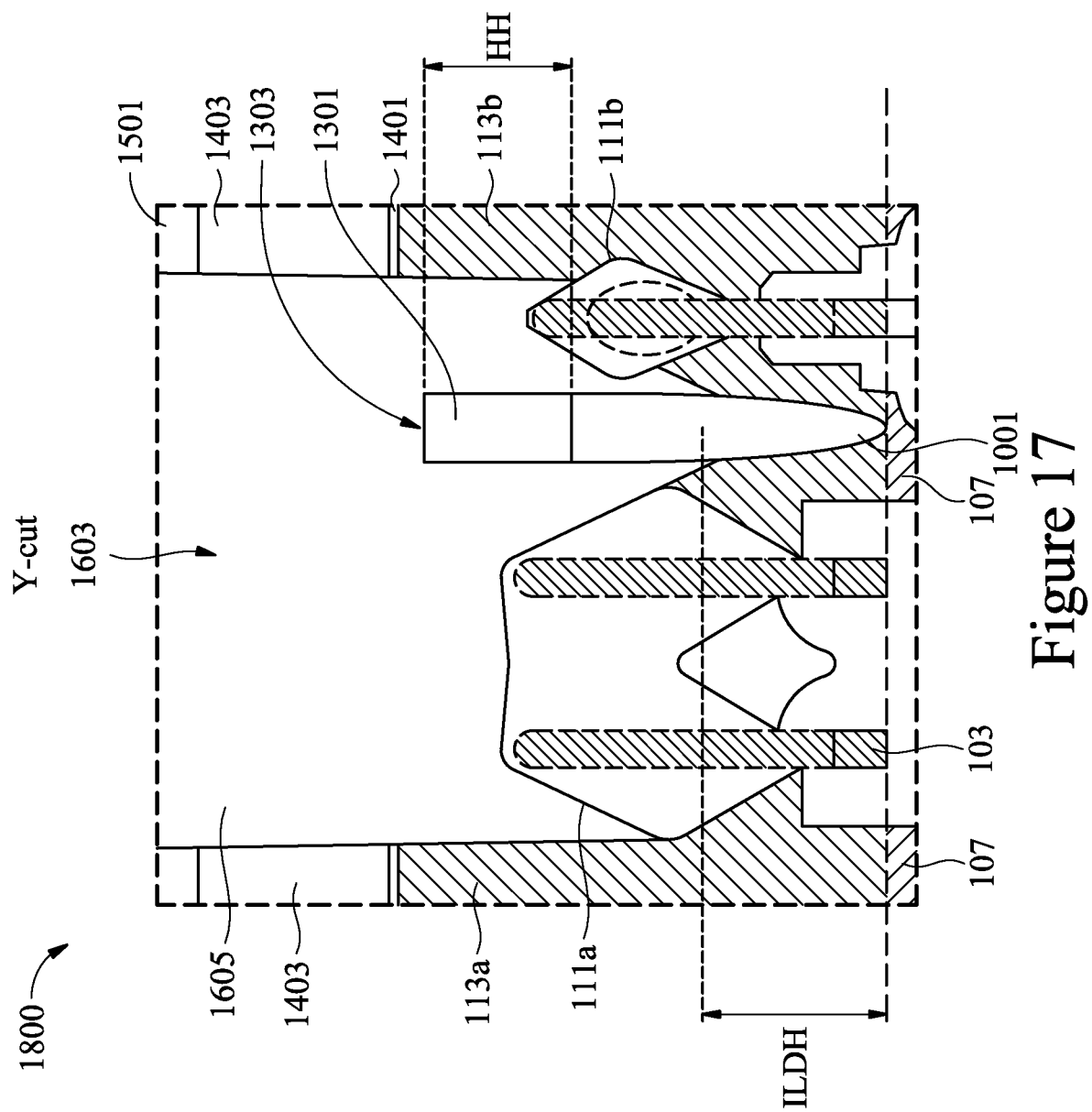

SEMICONDUCTOR DEVICE AND METHOD

PRIORITY CLAIM AND CROSS-REFERENCE

This application claims the benefit of U.S. Provisional Application No. 62/753,705, filed on Oct. 31, 2018, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 17 illustrates, in greater detail, the removal process for forming the contact opening over the source/drain region of the "Y-cut" illustrated in FIG. 16 in accordance with some embodiments.

DETAILED DESCRIPTION

Figure 1:
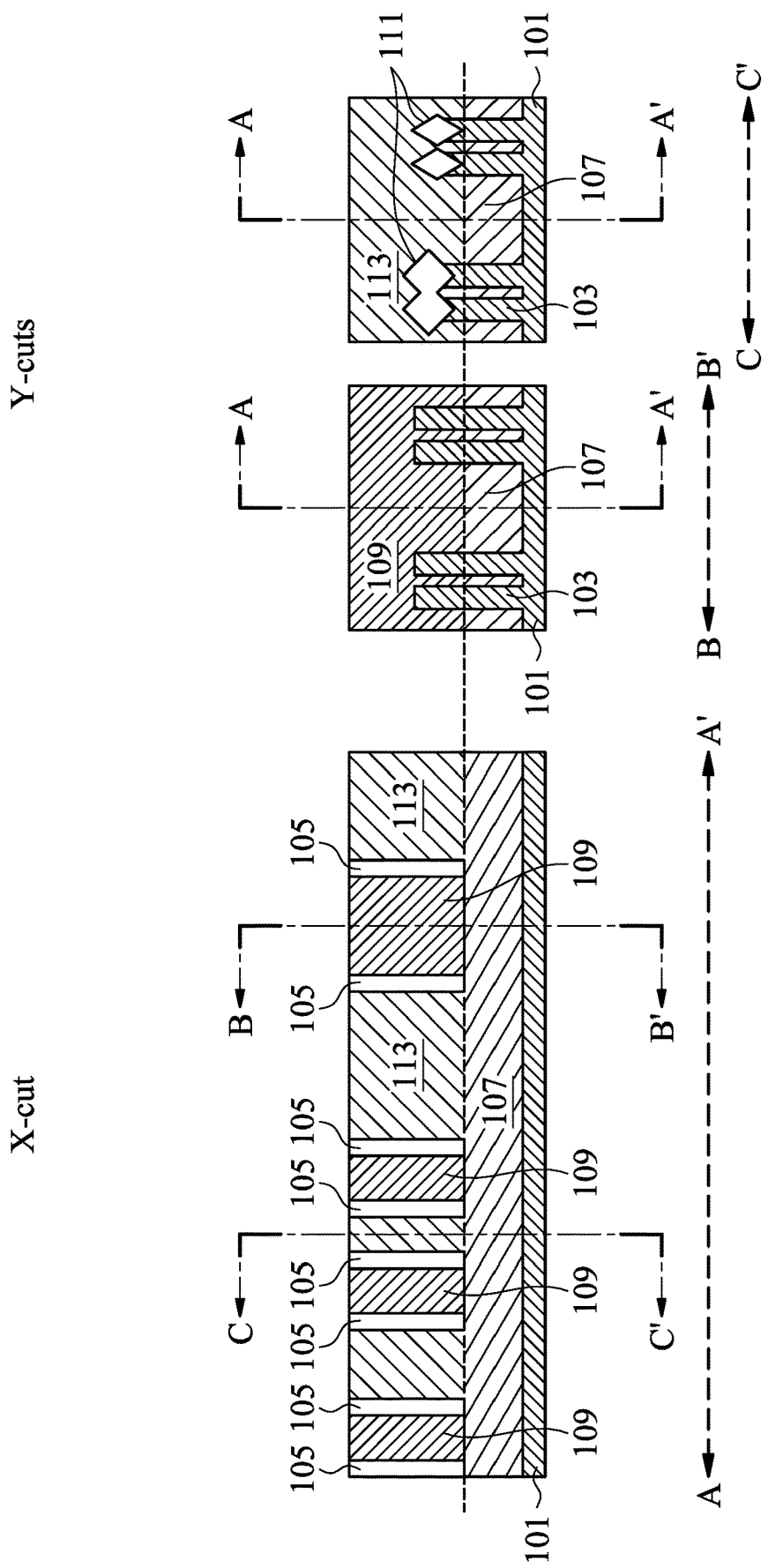
FIG. 1 illustrates some initial steps in forming semiconductor fins in a substrate and forming metal gate electrodes over channel regions of the semiconductor fins in the fabrication of a semiconductor device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

This disclosure relates to a semiconductor device and its manufacturing method, and more particularly to a semiconductor device comprising a fin field effect transistor (FinFET) with a cut metal gate (CMG) and a method of manufacturing the semiconductor device. Embodiments disclosed herein are directed towards the formation of a plurality of fin-type field effects transistors (finFETs) within a wafer. Each of FIGS. 1-17 illustrate intermediate steps in the fabrication of the finFETs with FIGS. 1-16 using three cross-sectional views that are taken through an intermediate structure formed using the intermediate steps associated with the respective figures. The first cross-sectional views are illustrated as an "X-cut" (taken through line A-A' illustrated in association with second and third cross-sectional views as "Y-cut" figures). The second cross-sectional views are illustrated as a first "Y-cut" (taken through line B-B' illustrated in the associated "X-cut" figure) of a gate structure of the series of gate structures in an area of a cut metal gate (CMG) of the respective intermediate structures in a direction perpendicular to the fins of the finFETS being formed. The third cross-sectional views are illustrated as a second "Y-cut" (taken through line C-C' illustrated in the associated "X-cut" figure) of an area of an ILD0/EPI interface associated with the cut metal gate (CMG) of the respective intermediate structures in a direction perpendicular to the fins of the finFETS being formed. The first cross-sectional views are illustrated as an "X-cut" a series of gate structures formed within the respective intermediate structures in a direction parallel to the fins of the finFETs being formed.

FIG. 1 illustrates a substrate 101 and some initial steps in the formation of finFETs including patterning a plurality of fins 103 from the substrate 101. The substrate 101 may be a silicon substrate, although other substrates, such as semiconductor-on-insulator (SOI), strained SOI, and silicon germanium on insulator, could be used. The substrate 101 may be a p-type semiconductor, although in other embodiments, it could be an n-type semiconductor. The fins 103 may be patterned by forming trenches using any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

However, as one of ordinary skill in the art will recognize, the processes and materials described above to form the series of fins 103 are merely example processes, and are not meant to be the only embodiments. Rather, any suitable process through which the fins 103 may be formed may be utilized and any suitable process, including any number of masking and removal steps may be used. Once formed, these fins 103 may be used, as discussed below, to form the channel regions and source/drain (S/D) regions of a plurality of finFET transistors. While FIG. 1 only illustrates two pair of fins 103 formed from the substrate 101, any number of fins 103 may be utilized.

After the fins 103 have been formed within the substrate 101, first isolation regions 107, such as shallow trench isolation (STI) regions may be formed to isolate the fins 103 from other regions within the substrate 101. As such, the trenches may be filled with a dielectric material and the dielectric material may be recessed within the first trenches to form the first isolation regions 107. The dielectric material may be an oxide material, a high-density plasma (HDP) oxide, or the like. The dielectric material may be formed, after an optional cleaning and lining of the trenches, using either a chemical vapor deposition (CVD) method, a high density plasma CVD method, or any other suitable method of formation may be used.

The trenches may be filled by overfilling the trenches and the substrate 101 with the dielectric material and then removing the excess material outside of the trenches and the fins 103 through a suitable process such as chemical mechanical polishing (CMP), an etch, a combination of these, or the like. In an embodiment, the removal process removes any dielectric material that is located over the fins 103 as well, so that the removal of the dielectric material will expose the surface of the fins 103 to further processing steps.

Once the trenches have been filled with the dielectric material, the dielectric material may then be recessed away from the surface of the fins 103. The recessing may be performed to expose at least a portion of the sidewalls of the fins 103 adjacent to the top surface of the fins 103. The dielectric material may be recessed using a wet etch by dipping the top surface of the fins 103 into an etchant such as HF, although other etchants, such as $H_2$, and other methods, such as a reactive ion etch, a dry etch with etchants such as $NH_3/NF_3$, chemical oxide removal, or dry chemical clean may be used. The dielectric material may be recessed to a distance from the surface of the fins 103 of between about 50 Å and about 500 Å, such as about 400 Å. Additionally, the recessing may also remove any leftover dielectric material located over the fins 103 to ensure that the fins 103 are exposed for further processing.

The steps described above may be only part of the overall process flow used to fill and recess the dielectric material. For example, lining steps, cleaning steps, annealing steps, gap filling steps, combinations of these, and the like may also be utilized to form and fill the trenches with the dielectric material. All of the potential process steps are fully intended to be included within the scope of the present embodiment.

After the isolation regions 107 have been formed, a dummy gate dielectric (or interface oxide) layer, a dummy gate electrode layer over the dummy gate dielectric layer, and a dummy gate spacer layer may be formed over each of the fins 103. In an embodiment the dummy gate dielectric layer may be formed by thermal oxidation, chemical vapor deposition, sputtering, or any other methods known and used in the art for forming a gate dielectric. Depending on the technique of gate dielectric formation, the dummy gate dielectric layer thickness on the top of the fins 103 may be different from the dummy gate dielectric layer thickness on the sidewall of the fins 103.

The dummy gate dielectric layer may comprise a material such as silicon dioxide or silicon oxynitride with a thickness of between about 3 Å and about 100 Å, such as about 10 Å. The dummy gate dielectric layer may be formed from a high permittivity (high-k) material (e.g., with a relative permittivity greater than about 5) such as lanthanum oxide ($La_2O_3$), aluminum oxide ($Al_2O_3$), hafnium oxide ($HfO_2$), hafnium oxynitride (HfON), or zirconium oxide ($ZrO_2$), or combinations thereof, with an equivalent oxide thickness of between about 0.5 Å and about 100 Å, such as about 10 Å or less. Additionally, any combination of silicon dioxide, silicon oxynitride, and/or high-k materials may also be used for the dummy gate dielectric layer.

The dummy gate electrode layer may comprise a conductive material and may be selected from a group comprising of polysilicon (e.g., a dummy polysilicon (DPO)), W, Al, Cu, AlCu, W, Ti, TiAlN, TaC, TaCN, TaSiN, Mn, Zr, TiN, Ta, TaN, Co, Ni, combinations of these, or the like. The dummy gate electrode layer may be deposited by chemical vapor deposition (CVD), sputter deposition, or other suitable techniques for depositing conductive materials. The thickness of the dummy gate electrode layer may be between about 5 Å and about 200 Å. The top surface of the dummy gate electrode layer may have a non-planar top surface, and may be planarized prior to patterning of the dummy gate electrode layer or performing the gate etching process. Ions may or may not be introduced into the dummy gate electrode layer at this point. Ions may be introduced, for example, by ion implantation techniques.

Once formed, the dummy gate dielectric layer and the dummy gate electrode layer may be patterned to form a series of dummy gates over the fins 103. The dummy gates define multiple channel regions located on each side of the fins 103 beneath the dummy gate dielectric layer. The dummy gates may be formed by depositing and patterning a gate mask on the dummy gate electrode layer using, for example, any suitable deposition and photolithography techniques. The gate mask may incorporate any suitable masking and sacrificial materials, such as (but not limited to) silicon oxide, silicon oxynitride, SiCON, SiC, SiOC, and/or silicon nitride and may be deposited to a thickness of between about 5 Å and about 200 Å. The dummy gate electrode layer and the dummy gate dielectric layer may be etched using a dry etching process to form the patterned dummy gates.

Once the dummy gates have been patterned, the spacers 105 may be formed. The spacers 105 may be formed on opposing sides of the dummy gates. The spacers 105 are formed, for example, by blanket depositing a spacer layer on the previously formed structure. The spacer layer may comprise SiCON, SiN, oxynitride, SiC, SiON, SiOC, oxide, or the like and may be formed by any suitable methods to form such a layer, such as chemical vapor deposition (CVD), plasma enhanced chemical vapor deposition (PECVD), sputter, and any other suitable methods. The spacer layer may comprise a different material with different etch characteristics or the same material as the dielectric material within the first isolation regions 107. The spacers 105 may then be patterned, such as by one or more etches to remove the spacer layer from the horizontal surfaces of the structure, to form the spacers 105.

Once the spacers 105 have been formed, a removal of portions of the fins 103 not protected by the dummy gates and the spacers 105 are removed using a reactive ion etch (RIE) using the dummy gates and the dummy gate spacer layer as hardmasks, or by using any other suitable removal process. The removal may be continued until the fins 103 are either planar with or below the surface of the STI regions.

Once the portions of the fins 103 have been removed, a hard mask is placed and patterned to cover the series of dummy gates and the fins 103 are regrown, e.g., through a selective epitaxial (EPI) growth process of the material of the fins 103, to form S/D regions 111 of the finFETs being developed. In an embodiment wherein the fins 103 comprise silicon and the FinFET is a p-type device, the source/drain regions 111 may be regrown with a material, such as silicon, silicon germanium, silicon phosphorous, which has a different lattice constant than the channel regions. The epitaxial growth process may use precursors such as silane, dichlorosilane, germane, or the like, and may continue for between about 5 minutes and about 120 minutes, such as about 30 minutes. In other embodiments the source/drain regions 111 may comprise materials such as GaAs, GaP, GaN, InP, InAs, InSb, GaAsP, AlGaN, AlInAs, AlGaAs, GaInAs, GaInP, and/or GaInAsP; or combinations, or the like.

Once the source/drain regions 111 are formed, dopants may be implanted into the source/drain regions 111 by implanting appropriate dopants to complement the dopants in the fins 103. For example, p-type dopants such as boron, gallium, indium, or the like may be implanted to form a PMOS device. Alternatively, n-type dopants such as phosphorous, arsenic, antimony, or the like may be implanted to form an NMOS device. These dopants may be implanted using the dummy gates and the spacer 105 as masks. However, any other suitable processes, steps, or the like may be used to implant the dopants. For example, a plurality of implantation processes may be performed using various combinations of spacers and liners to form source/drain regions having a specific shape or characteristic suitable for a particular purpose. Any of these processes may be used to implant the dopants, and the above description is not meant to limit the present embodiments to the steps presented above.

Additionally at this point the hard mask that covered the dummy gates during the formation of the source/drain regions 111 is removed. In an embodiment the hard mask may be removed using, e.g., a wet or dry etching process that is selective to the material of the hard mask. However, any suitable removal process may be utilized.

Once the hard mask has been removed, an etch stop layer may be deposited over the source/drain regions 111 and between the spacers 105. In an embodiment the etch stop layer may be a dielectric material such as silicon nitride, SiCN, or SiCON. deposited within a deposition chamber using, for example, one or more of a chemical vapor deposition (CVD), an atomic layer deposition (ALD) process, a plasma enhanced chemical vapor deposition (PECVD), a low pressure chemical vapor deposition (LPCVD), or the like. However, any suitable materials and any suitable processes may be utilized to deposit the etch stop layer.

Then, an interlayer dielectric (ILD) layer 113 (e.g., ILD0 layer) is deposited over the semiconductor substrate 101. According to some embodiments, the ILD layer 113 may comprise a material such as silicon oxide ($SiO_2$) or boron phosphorous silicate glass (BPSG), although any suitable dielectrics may be used. The ILD layer 113 may be formed using a chemical vapor deposition (CVD) process such as plasma enhanced chemical vapor deposition (PECVD), although any other suitable processes, such as low pressure chemical vapor deposition (LPCVD), may also be used.

Once formed, the ILD layer 113 may be annealed using, e.g. a first annealing process. In an embodiment the first annealing process may be a thermal anneal wherein the substrate 101 and the ILD layer 113 are heated within, e.g., in a furnace, within an inert atmosphere. The first anneal process may be performed at a temperature of between about 200° C. and about 1000° C., such as about 500° C., and may be continued for a time of between about 60 s and about 360 min, such as about 240 min.

Once deposited and annealed, the ILD layer 113 is planarized to expose the dummy gates in a planar surface of the ILD layer 113. Once exposed, the dummy gates are subsequently removed using, e.g., a wet etch process and are replaced with the metal gates 109, including, for example, a high-k gate dielectric, one or more conductive barrier layers, one or more work function layers, and a conductive fill material.

According to some embodiments, the high-k gate dielectric includes materials such as $HfO_2$, $ZrO_2$, $HfZrO_x$, $HfSiO_x$, $HfSiON$, $ZrSiO_x$, $HfZrSiO_x$, $Al_2O_3$, $HfAlO_x$, $HfAlN$, $ZrAlO_x$, $La_2O_3$, $TiO_2$, $Yb_2O_3$, or the like and may be a single layer or a composite layer that is formed using a deposition process such as atomic layer deposition. However, any suitable materials and any suitable processes may be used to form the high-k gate dielectric.

According to some embodiments, the one or more diffusion barrier layers and the one or more work-function layer may be formed as a plurality of stacked layers. For example, the barrier layers may be formed as a layer of titanium nitride (TiN) which may (or may not) be doped with silicon. The work-function layer, in the case of a p-type FinFET may be formed with a respective metal gate 109 as a stacked layer including Ti, Al, TiAl, TiAlN, Ta, TaN, TiAlC, TaAlCSi, TaAlC, TiSiN, or the like. In the case of an n-type FinFET being formed with a respective metal gate 109, the work-function layer may be formed with a respective metal gate 109 as a stacked layer including TiN, TaN, TiAl, W, Ta, Ni, Pt, or the like. After the deposition of the work-function layer(s) in these embodiments, a barrier layer (e.g., another TiN layer) is formed.

According to some embodiments, the conductive fill material may be formed from a material such as tungsten, cobalt, copper, ruthenium, aluminum, or the like. The conductive fill material is deposited over the stacked layers of the high-k gate dielectric, the one or more conductive barrier layers, the one or more work function layers such that the remaining spaces, between respective spacers 105 of a respective metal gate 109 are filled or over-filled.

Once the layers of the metal gates 109 have been deposited and the remaining spaces are completely filled (or over-filled) with the conductive fill material, the materials are then planarized using a chemical mechanical polish (CMP) process. The CMP process may perform a thinning of the materials of the metal gates 109, the materials of respective spacers 105 and the ILD layer 113 until planarized surfaces of the metal gates 109 and planarized surfaces of the respective spacers 105 are exposed in a planar surface of the ILD layer 113.

Once the ILD layer 113 has been planarized and the planar surfaces of the metal gates 109 and the respective spacers 105 are exposed, the ILD layer 113 may again be annealed using, e.g. a second annealing process. In an embodiment the second annealing process may be a thermal anneal wherein the substrate 101 and the ILD layer 113 are heated within, e.g., a furnace, within an inert atmosphere. The second annealing process may be performed at a temperature of between about 200° C. and about 1000° C., such as about 500° C., and may be continued for a time of between about 60 s and about 360 min, such as about 240 min.

Figure 2:
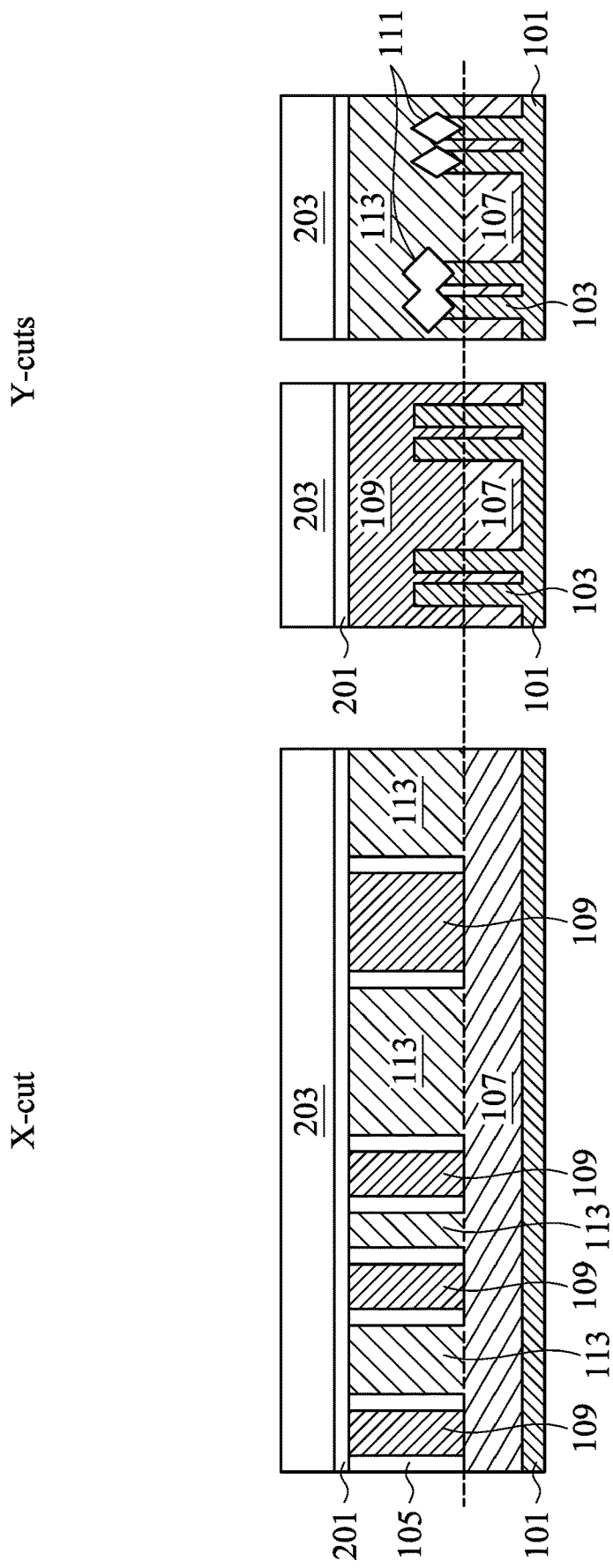
FIG. 2 illustrates a deposition process in accordance with some embodiments.

Turning to FIG. 2, this figure illustrates some initial steps in forming a "cut metal gate" (CMG) through one or more of the metal gates 109 of the intermediate structure illustrated in FIG. 1. Once the metal gates 109 have been planarized, a series of hard mask layers may be formed over the planarized surface of the metal gates 109 and the ILD layer 113.

In some embodiments, a first layer in the series of masking layers may be a contact etch stop layer (CESL) 201. The contact etch stop layer 201 may be formed over the planarized surfaces of the metal gates 109 and ILD layer 113 by depositing a material such as Si, TiN, SiN, $SiO_2$, combinations thereof, or the like using a deposition method such as atomic layer deposition (ALD), plasma enhanced chemical vapor deposition (PECVD), chemical vapor deposition (CVD), or the like. However, any suitable materials and any suitable methods may be used to form the contact etch stop layer 201.

A hard mask layer 203 may be deposited over the contact etch stop layer (CESL) 201 as a second layer of the first series of masking layers. The hard mask layer 203 is formed over the contact etch stop layer 201 from a second hard mask material such as SiN, $SiO_2$, combinations thereof, or the like. The second hard mask material used to form the hard mask layer 203 is different from the first hard mask material used to form the contact etch stop layer 201. As such, the contact etch stop layer 201 may serve as an etch stop of a subsequent patterning of the hard mask layer 203. According to some embodiments, the hard mask layer 203 may be placed over the contact etch stop layer 201 using a deposition method such as atomic layer deposition (ALD), plasma enhanced chemical vapor deposition (PECVD), chemical vapor deposition (CVD), or the like. However, any suitable materials and any suitable methods may be used to form the hard mask layer 203. However, any suitable material and process of formation may be used for the hard mask layer 203 in the first series of hard masking layers.

Figure 3:
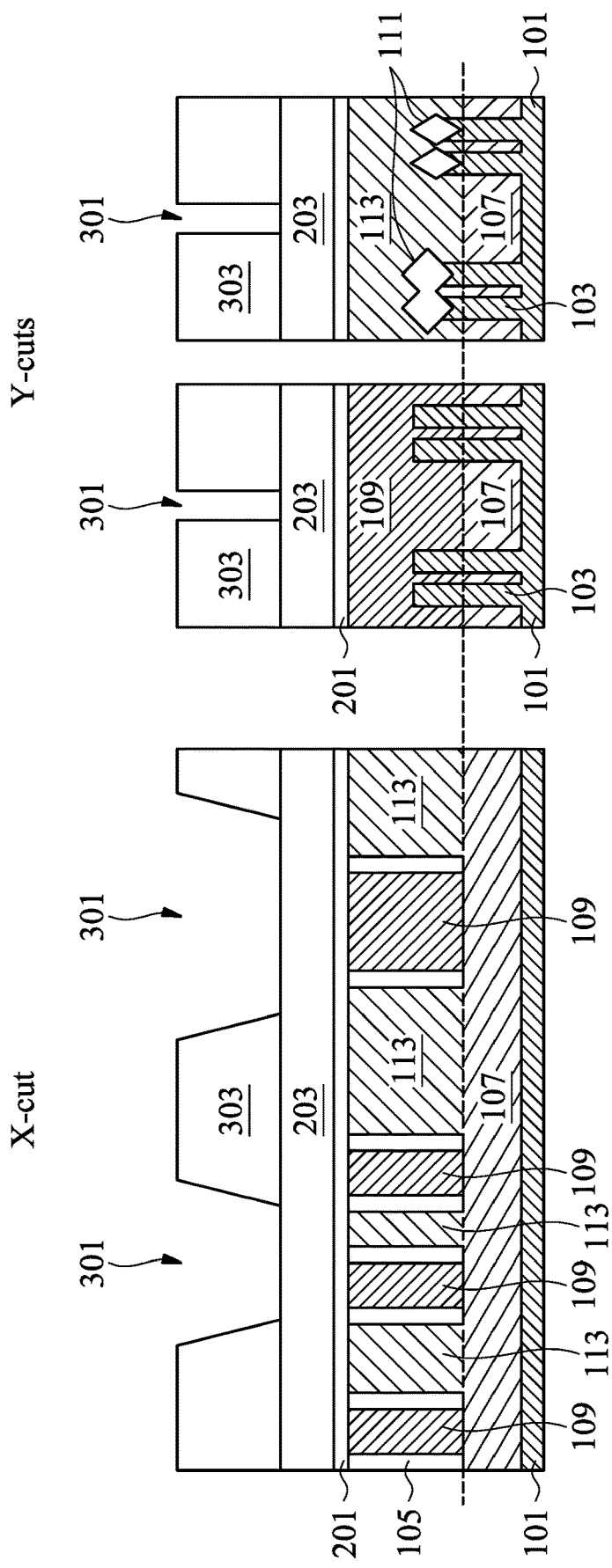
FIG. 3 illustrates a deposition and patterning process in accordance with some embodiments.

FIG. 3 illustrates a deposition and patterning process to form openings 301 through a photo resist layer 303 deposited over the second hard mask layer 203. According to embodiments, the photo resist layer 303 may be deposited over the second hard mask layer 203 as a third layer of the first series of masking layers. The photo resist layer 303 may be deposited using any suitable deposition process, may be formed to any suitable thickness, and may be patterned using any suitable photo lithography method to form the openings 301 through the photo resist layer 303 and to expose surfaces of the second hard mask layer 203 of the first series of hard masking layers in areas overlying one or more of the metal gates 109.

Figure 4:
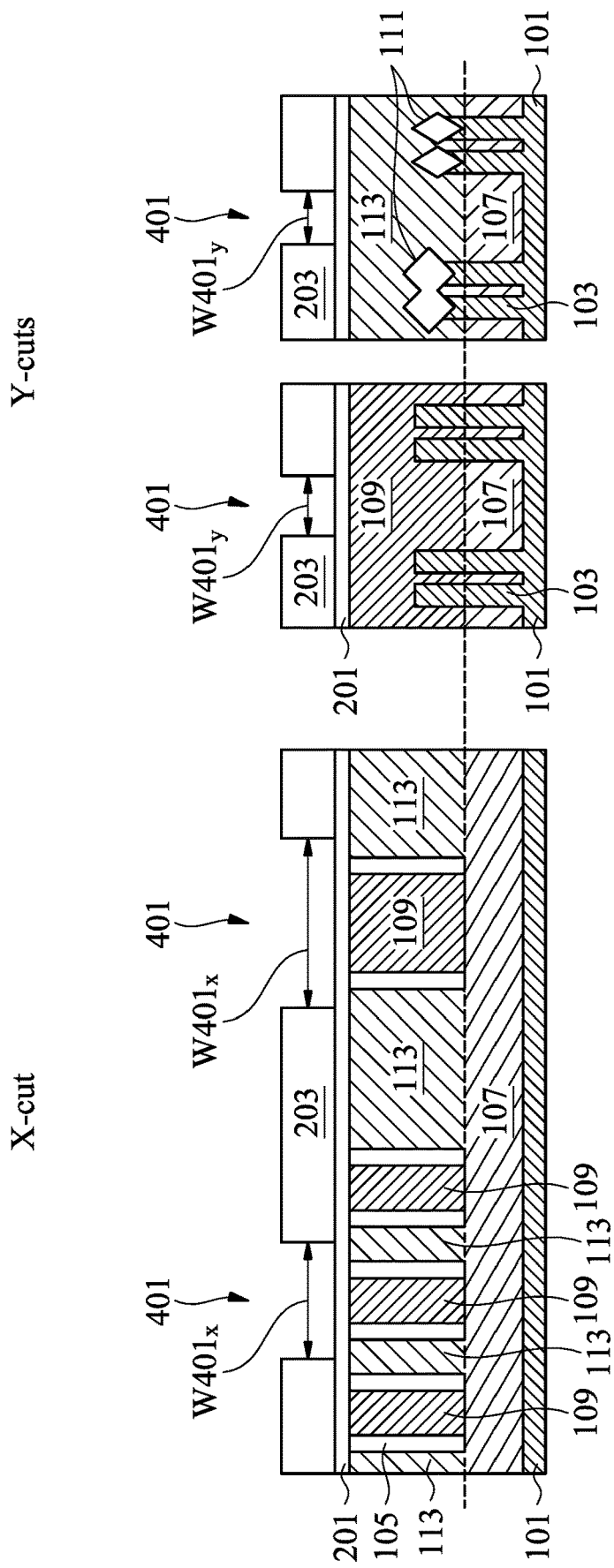
FIG. 4 illustrates a trench patterning process in accordance with some embodiments.

FIG. 4 illustrates a transferring of the pattern of the photo resist layer 303 of FIG. 3 into the second hard mask layer 203 using a first etchant to form a pattern of openings 401 through the hard mask layer 203. In some embodiments, the first etchant may use reactant gasses have a greater etching selectivity for the second hard mask material used to form the hard mask layer 203 than the first hard mask material used to form the first hard mask layer 201. As such, the first hard mask layer 201 serves as a contact etch stop layer and areas of the first mask layer 201 overlying the one or more of the metal gates 109 are exposed through the openings 401. In some embodiments, the etching process may be performed using, for example, carbon-and-fluorine-containing gases such as $CF_4$, $CH_2F_2$, $CHF_3$, or the like. However, any suitable may be used for the first etchant.

According to some embodiments, the openings 401 in the X-cut view may be formed to one or more widths $W401_X$ of between about 10 nm and about 500 nm, such as about 100 nm and in the Y-cut view may be formed to one or more widths $W401_Y$ of between about 1 nm and about 50 nm, such as about 30 nm. However, any suitable widths may be used for the openings 401. Once the openings 401 have been formed, the remaining photo resist layer 303 is removed.

Figure 5:
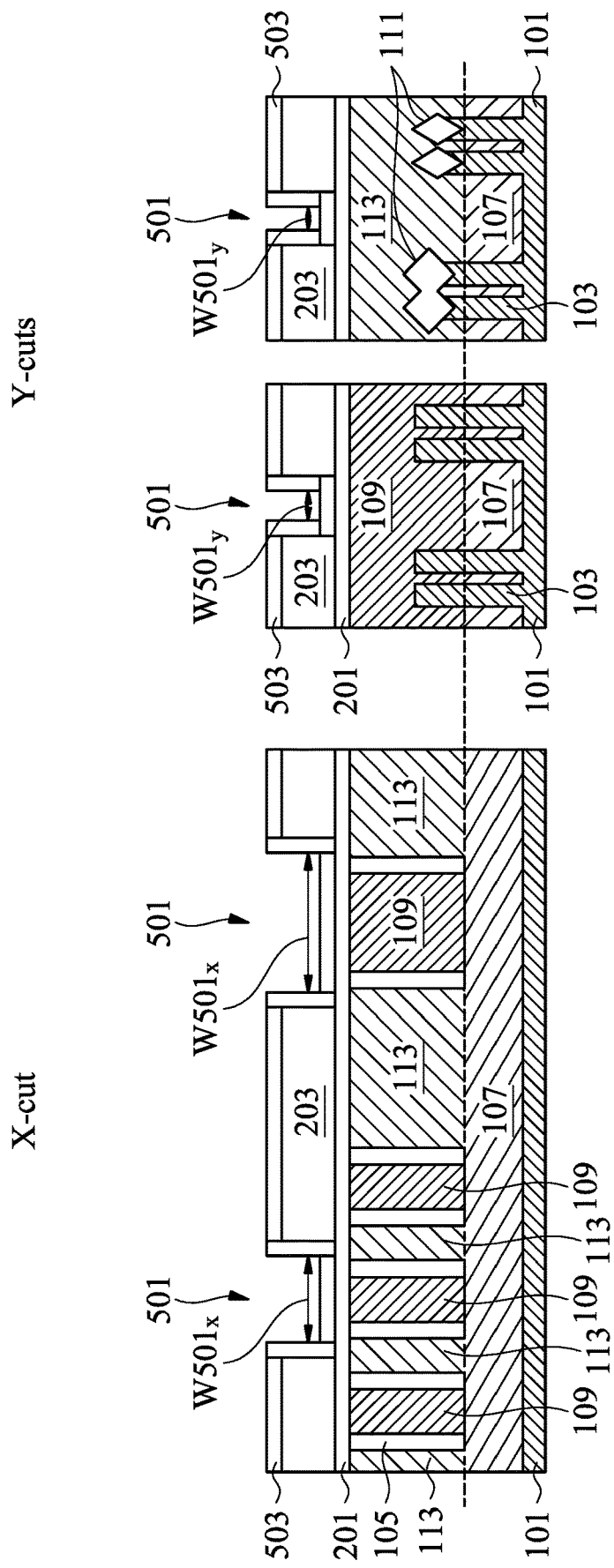
FIG. 5 illustrates a deposition process in accordance with some embodiments.

FIG. 5 illustrates a narrowing of openings 401 to form narrow opening 501 via a re-deposition of the second hard mask material as a blanket mask layer 503. The blanket mask layer 503 may be formed, for example, through a conformal deposition process such as chemical vapor deposition (CVD) or atomic layer deposition (ALD) such that the blanket mask layer 503 lines the exposed surfaces of the first hard mask layer 201, lines the exposed surfaces of the second hard mask layer 203, and lines the sidewalls of the openings 401 through the second mask layer 203. According to some embodiments, the blanket mask layer 503 may be formed of the same second hard mask material (e.g., silicon nitride) used to form the second hard mask layer 203. In embodiments, the blanket mask layer 503 is formed to a highly uniform thickness of between about 10 Å and about 100 Å, such as about 50 Å. As such, the narrow openings 501 in the X-cut view may be formed to one or more widths $W501_X$ of between about 10 nm and about 500 nm, such as about 100 nm and in the Y-cut views may be formed to one or more widths $W501_Y$ of between about 1 nm and about 50 nm, such as about 30 nm. However, any suitable widths may be used for the narrow openings 501.

Figure 6:
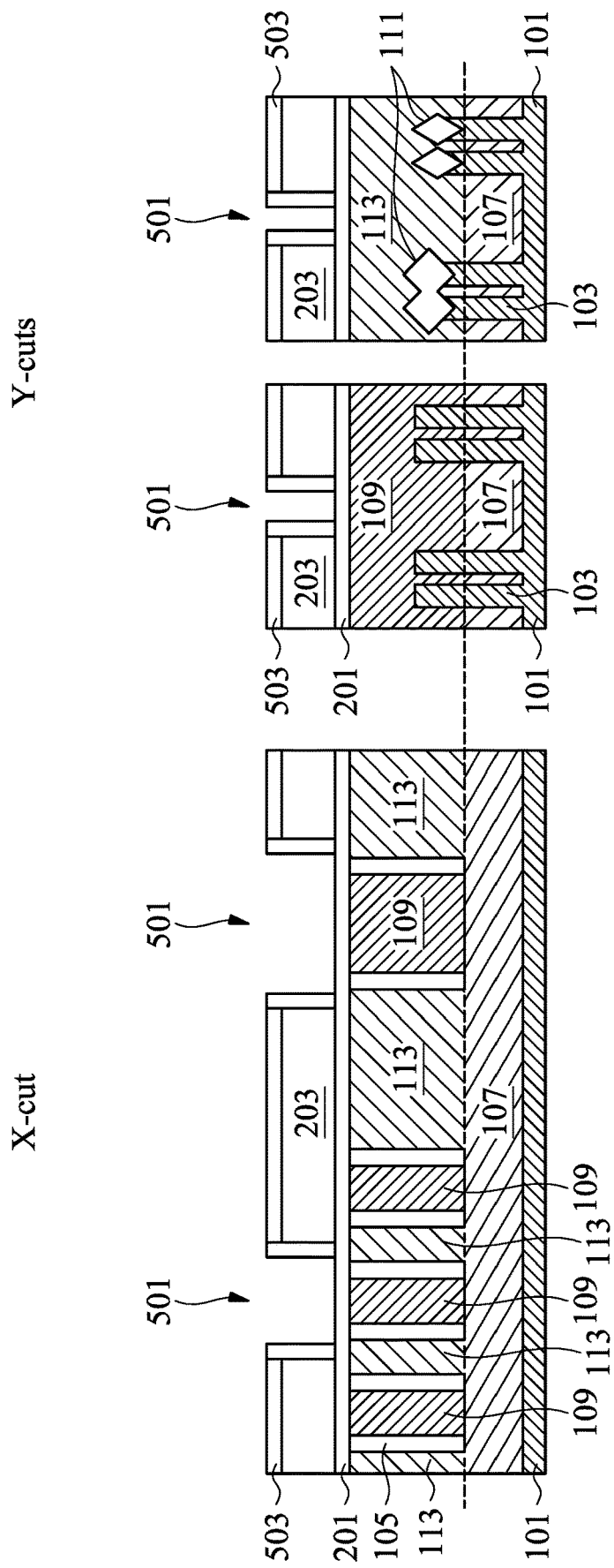
FIG. 6 illustrates a removal process in accordance with some embodiments.

FIG. 6 illustrates an anisotropic etching process performed to remove portions of the blanket mask layer 503 lining the bottoms of the narrow openings 501. The first hard mask layer 201 serves as a contact etch stop layer during the anisotropic etching process. As such, at least portions of the areas of the first mask layer 201, overlying the one or more of the metal gates 109, are re-exposed through the narrow openings 501. In the anisotropic etch, the horizontal portions of the blanket mask layer 503 lining the bottoms of the narrow openings 501 are removed whereas, the remaining vertical portions on the sidewalls of the narrow openings 501 remain intact. As such, the vertical portions on the sidewalls of the narrow openings 501 form full rings having dimensions corresponding to the widths W501$_X$ and W501$_Y$ as illustrated in FIG. 5 and corresponding to the cut lines A-A', B-B', C-C' as illustrated in FIG. 1. In some embodiments, the anisotropic etching process may be performed to remove the blanket mask layer 503 lining the bottoms of the narrow openings 501 using, for example, carbon-and-fluorine-containing gases such as $CF_4$, $CH_2F_2$, $CHF_3$, or the like. However, any suitable gasses may be used for the anisotropic etching process.

Figure 7:
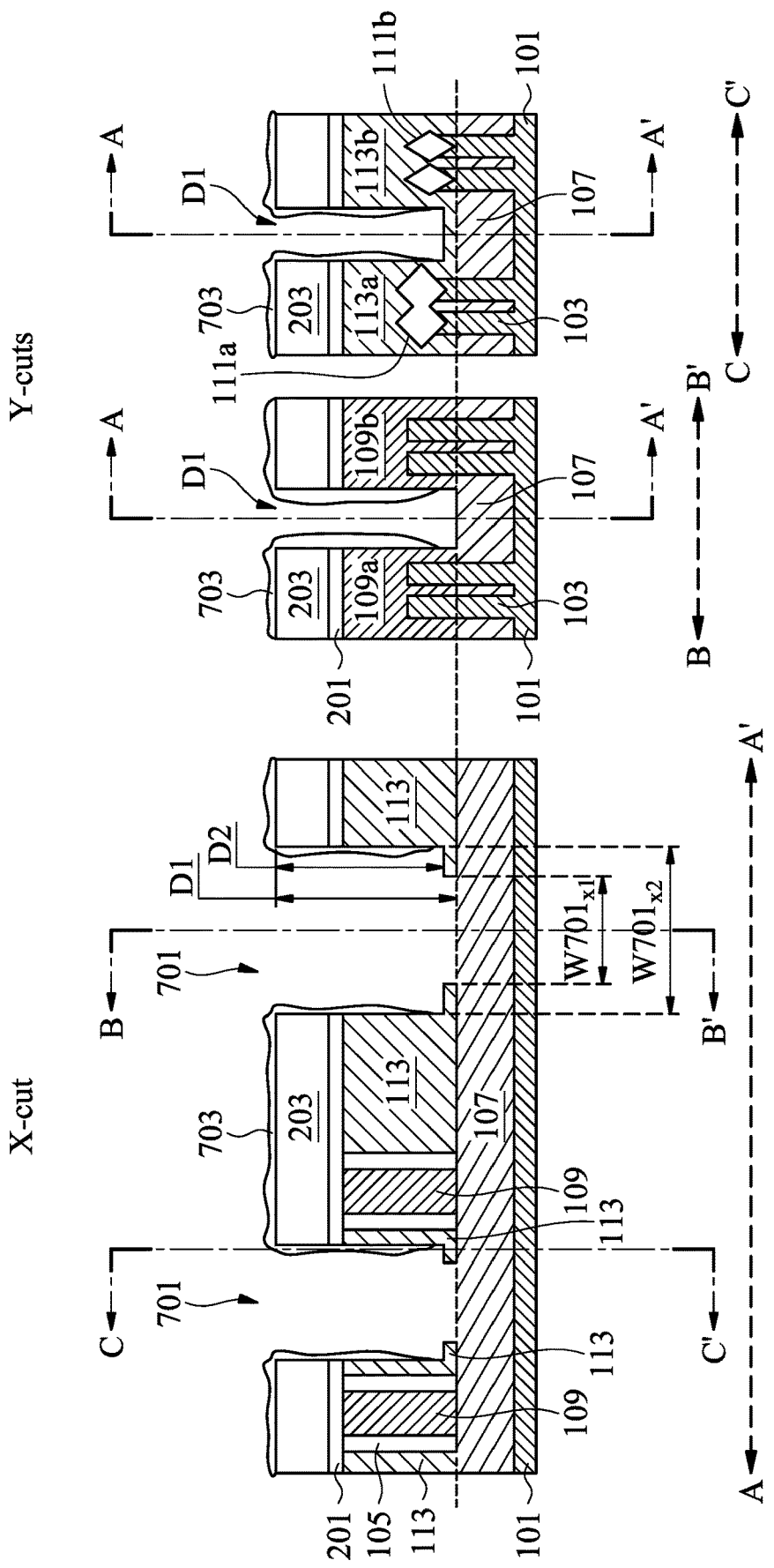
FIG. 7 illustrates forming of a plurality of cut metal gate openings through a plurality of the metal gates in accordance with some embodiments.

FIG. 7 illustrates a cut-metal gate (CMG) etching process performed to remove the exposed portions of the areas of the first mask layer 201 and to remove the one or more target portions of the metal gates 109, the associated spacers 105 and portions of the ILD layer 113 in order to form CMG trenches 701. This CMG etching process separates the one or more target portions of the metal gates 109 into first metal gate sections 109a and second metal gate sections 109b, effectively "cutting" the first sections from the second sections as shown in the first Y-cut of FIG. 7. The CMG etching process also separates the one or more target portions of the ILD layer 113 of the source/drain regions into first ILD sections 113a and second ILD sections 113b, effectively "cutting" the first sections from the second sections as shown in the second Y-cut of FIG. 7. According to some embodiments, the CMG etching process comprises a dry etching using chlorine-containing or fluorine-containing gases, such as $Cl_2$, $NF_3$, $SiCl_4$, $BCl_3$, $O_2$, $N_2$, $H_2$, Ar, combinations thereof or the like. However, any suitable dry etching gases may be used for the CMG etching process.

In some embodiments, the CMG trenches 701 are formed to a first depth D1 in a first portion of the CMG trench 701 and are formed to a second depth D2 in a second portion of the CMG trenches 701. The first portions of the CMG trenches 701 are formed by removing the materials of the target portions of the metal gates 109, removing the materials of the target portions of the spacers 105, and removing the materials of portions of the ILD layer 113 underlying the target portions of the metal gates 109 and the target portions of the spacers 105. As such, the first portions of the CMG trenches 701 are formed to a first width W701$_{X1}$ corresponding to the widths of the target gates of the metal gates 109 and corresponding to the thicknesses of the target spacers 105 in the ILD layer 113.

The second portion of the CMG trenches 701 are formed by removing the materials of the blanket mask layer 503 formed along the vertical sidewalls of the openings 401 through the second mask layer 203 and by removing the materials of the portions of the ILD layer 113 underlying the blanket mask layer 503 formed along the vertical sidewalls of the openings 401 through the second mask layer 203. As such, the second portion of the CMG trenches 701 are formed to a second width W701$_{X2}$ corresponding to the widths of the openings W401$_X$ in the second hard mask layer 203.

FIG. 7 further illustrates in the first "Y-cut" view taken along the cut line B-B' near or at the center of the CMG trenches 701, the CMG trenches 701 are formed to the first depth D1 at which the target metal gates 109 are fully separated (i.e., "cut") into their first sections 109a and second sections 109b. Also illustrated in the second "Y-cut" view of FIG. 7 taken along the cut line C-C' near or at an area of the source/drain regions 111 of the CMG trenches 701, the CMG trenches 701 are formed to the second depth D2 at which a portion of the ILD layer 108 remains above the isolation regions 107 separating a portion of the fins 103 of adjacent devices.

According to some embodiments, the CMG trenches 701 may be formed to a first depth D1 of between about 50 nm and about 200 nm, such as about 100 nm and formed to a first width W701$_{X1}$ of between about 10 nm and about 500 nm, such as about 100 nm. The CMG trenches 701 may also be formed to a second depth D2 of between about 50 nm and about 200 nm, such as about 100 nm and formed to a second width W701$_{X2}$ of between about 1 nm and about 50 nm, such as about 30 nm. However, any suitable depths and any suitable widths may be used for the first depth D1 and the second depth D2 of the CMG trenches 701 and any suitable widths may be used for the first width W701$_{X1}$ and the second width W701$_{X2}$ of the CMG trenches 701.

As further illustrated in FIG. 7, during the CMG etching process, a residual byproduct material 703 (e.g., a polymer) may be formed as a byproduct of reactions between the materials of the second hard mask layer 503, the materials of the target metal gates 109, the materials of the spacers 105, the materials of the ILD layer 113 and the reactant gases during the CMG etching process. For example as illustrated in FIG. 7, the residual byproduct material 703 may be formed over the second mask layer 203 and along sidewalls of the CMG trenches 701.

Figure 8:
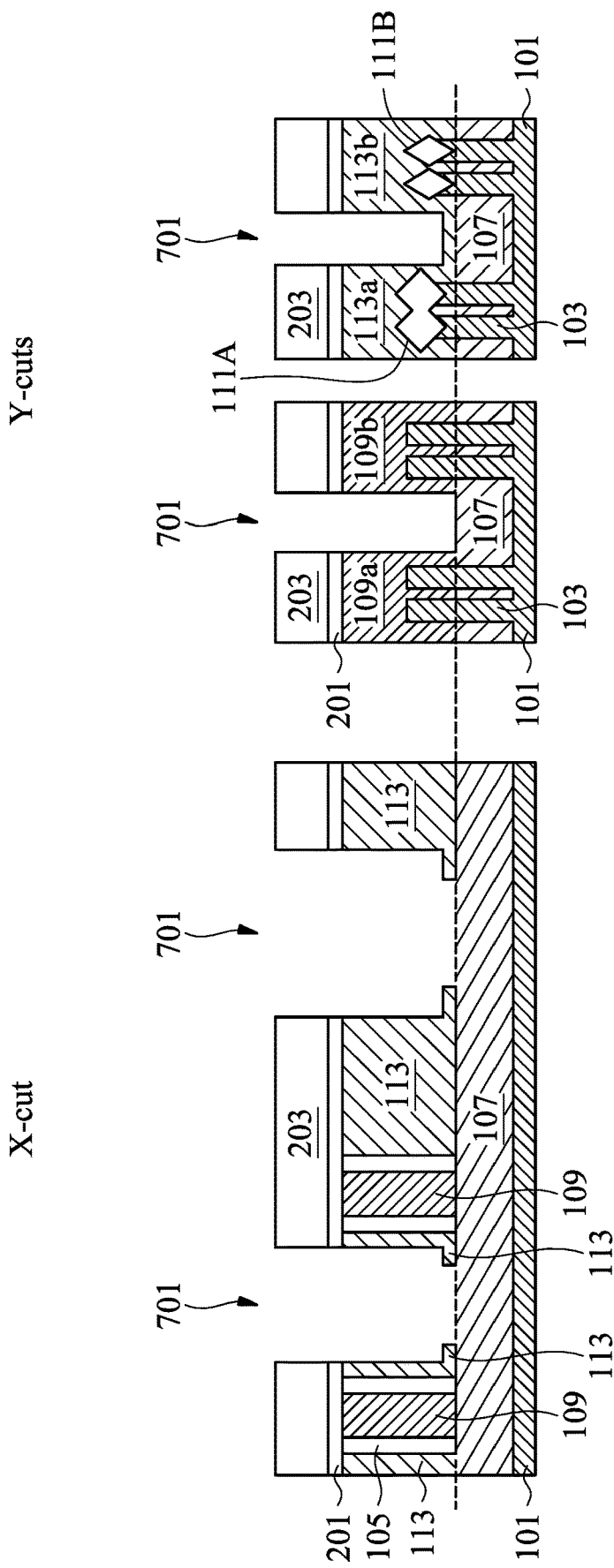
FIG. 8 illustrates a polymer byproduct removal and a wet cleaning process in accordance with some embodiments.

FIG. 8 illustrates a removal of the residual byproduct material 703. Once the CMG trenches 701 have been formed, a polymer removal process is performed to remove any residual polymer byproduct 703. For example, a non-plasma recipe with HF/$NH_3$ gas may be used to remove the polymer material. The non-plasma recipe with HF/$NH_3$ gas has low selectivity to metal and may be adjusted to have different selectivity to SiN by adjusting pressures and temperatures during removal of the polymer byproduct 703.

Once the CMG polymer byproduct 703 has been removed, a wet clean is performed to ensure a clean surface of the CMG opening 701 for further processing. According to some embodiments, a solution such as an SC-1 or SC-2 cleaning solution may be utilized for the wet clean process. Although, other solutions such as a mixture of $H_2SO_4$ and $H_2O_2$ (known as SPM), or a solution of hydrogen fluoride (HF), may also be utilized. However, any suitable solution or any suitable process may be used for the wet clean process and are fully intended to be included within the scope of the embodiments.

Figure 9:
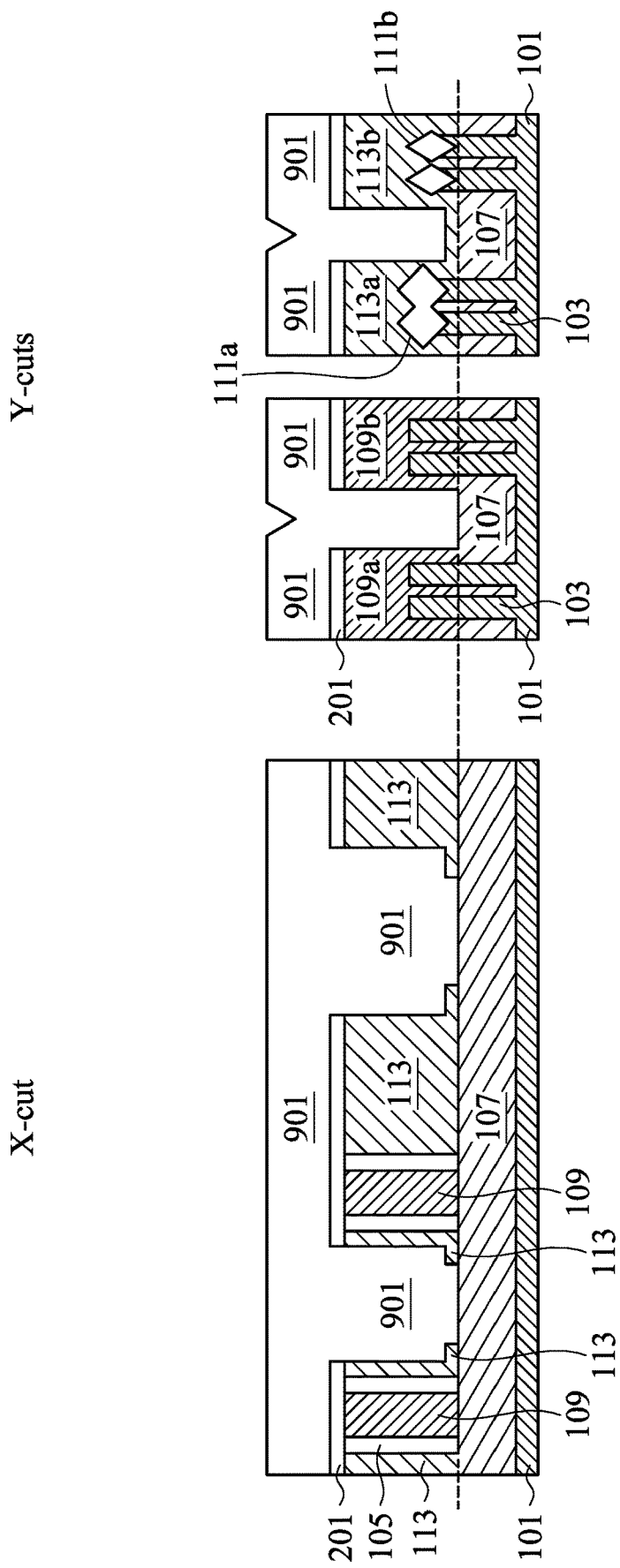
FIG. 9 illustrates a re-fill process in accordance with some embodiments.

FIG. 9 illustrates a deposition of a CMG fill material 901 over the CMG openings 701 in FIG. 8. Once the polymer 703 has been removed and the wet cleaning process has been performed, any remaining material of the second hard mask layer 203 may be removed. Once the second hard mask layer 203 has been removed, the CMG trenches 701 are filled with the first CMG refill material 901 is a dielectric material such as silicon nitride (SiN), silicon oxycarbide (SiOC), and/or silicon oxycarbonitride (SiOCN), wherein carbon is between about 1% and 10% of the compound by weight and/or wherein nitrogen is less than about 50% of the compound by weight, and may be represented by the formula $(Si)_{(1-y)}N_y$, $(SiO)_{(1-x)}C_x$, and/or $(SiO)_{(1-x-y)}C_xN_y$, wherein x=0.01-0.1 and y<0.5. The first CMG refill material 901 may be deposited using a deposition processes such as PECVD, ALD, CVD, or the like. In an embodiment, the first CMG refill material 901 may be deposited over the first hard mask layer 201 and overfill the CMG openings 701 to a level above the top surface of the first hard mask layer 201.

Figure 10:
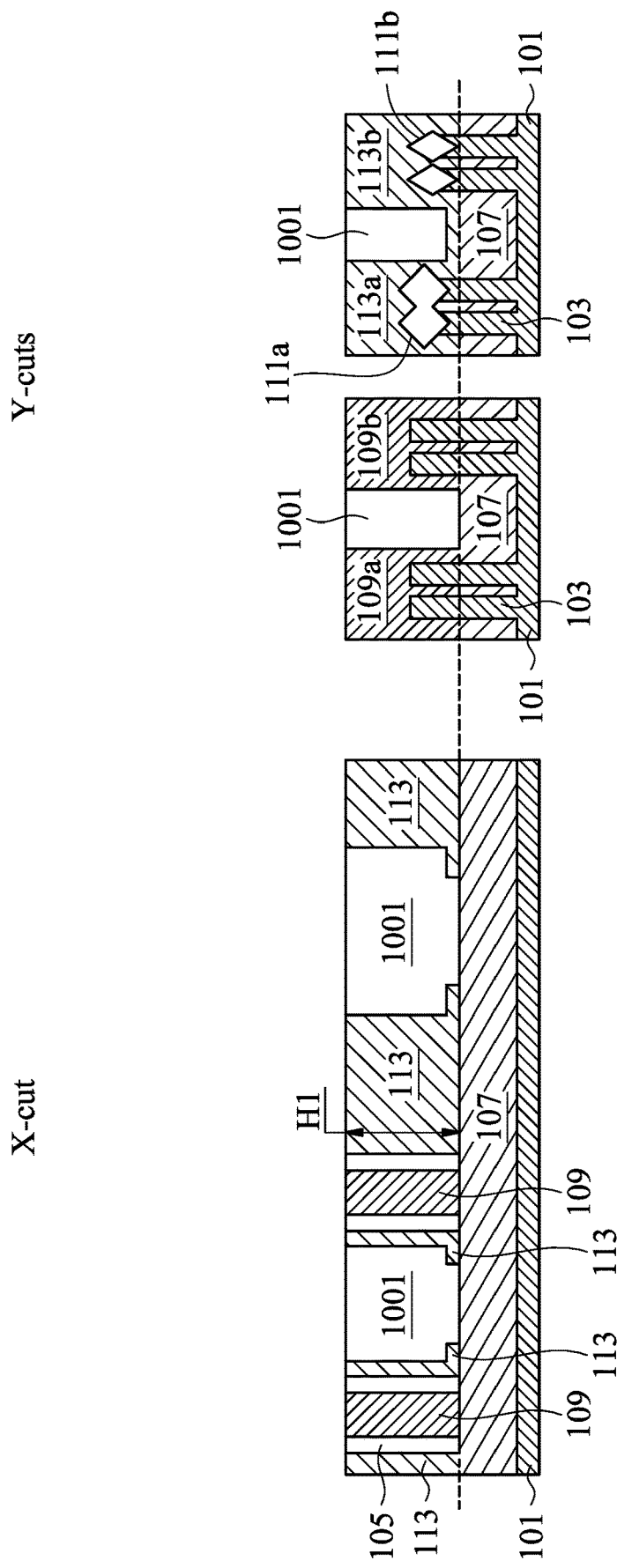
FIG. 10 illustrates a planarization process in accordance with some embodiments.

Referring to FIG. 10, this figure illustrates a planarization of the first CMG refill material 901 which may be performed using, for example, a chemical mechanical (CMP) planarization process to remove the excess material of the first CMG refill material 901. The CMP planarization process may continue until the first hard mask layer 201 has been fully removed and may continue until surfaces of the first CMG refill material 901, surfaces of the metal gates 109 and the respective spacers 105 are exposed within a planar surface of the ILD layer 113. As such, CMG plugs 1001 are formed from remaining material of the CMG refill material 901 disposed within the ILD layer 113. In some embodiments, once reduced, the heights of the metal gates 109 and the heights of the CMG plugs 1001 may be reduced to an overall first height H1 of between about 5 nm and about 50 nm, such as about 20 nm. However, any suitable heights may be used for the metal gates 109 and the CMG refill plugs 1001.

Figure 11:
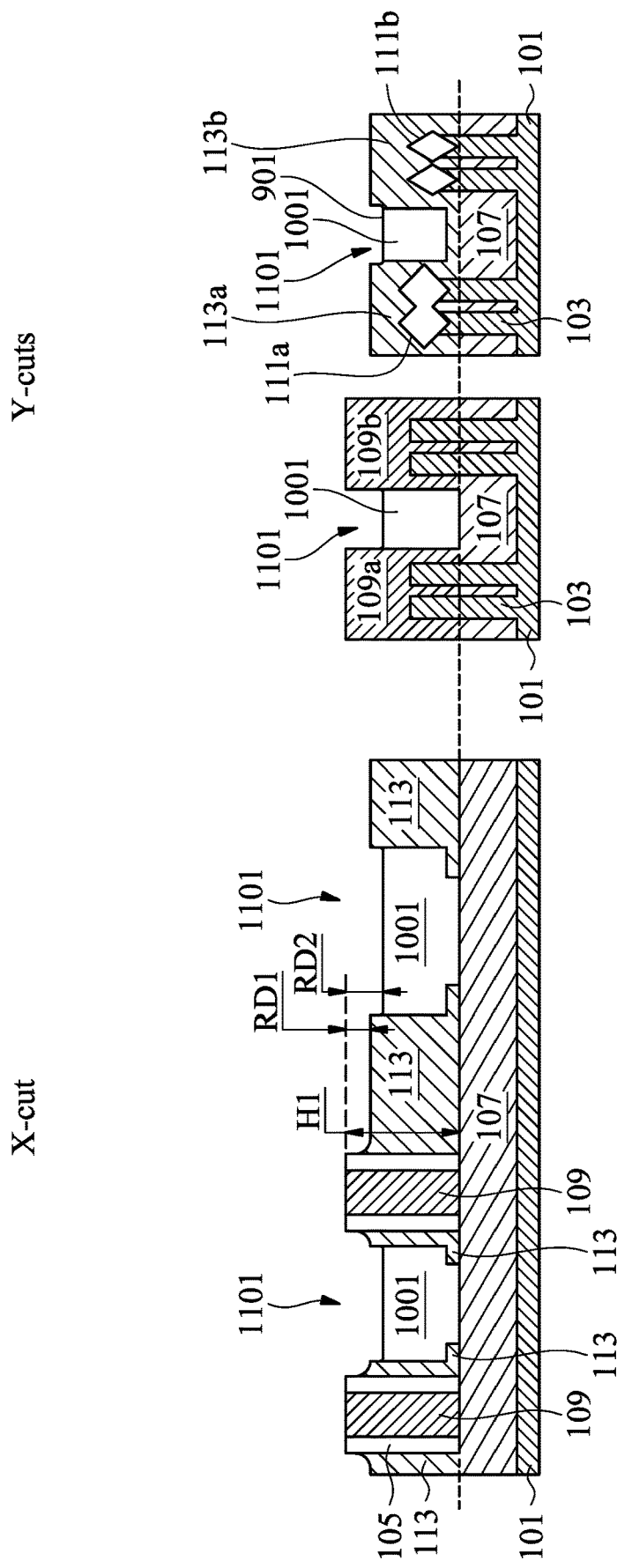
FIG. 11 illustrates a recessing process in accordance with some embodiments.

FIG. 11 illustrates a recessing of the CMG refill plugs 1001 and the ILD layer 113 to form shallow recesses 1101. The CMG refill plugs 1001 and the ILD layer 113 are recessed using, e.g., a wet etching process and is referred herein as a shallow recess etch. The shallow recess etch may be a timed etching process that has a first etch rate for the material of the ILD layer 113 and a second etch rate for the material of the CMG refill plugs 1001, wherein the second etch rate is greater than the first etch rate. As such, the shallow recess etch has an etching ratio ERatio1 of ILD/CMG materials, wherein 0≤ER1≤1. Accordingly, the CMG refill plugs 1001 are recessed by the shallow recess etch to a greater extent than the ILD layer 113 is recessed by the shallow recess etch.

In some embodiments, the etching ratio ER1 of ILD/CMG materials for the shallow recess etch may be between about 0:1 and about 1:1, such as about 0.5:1 and the time of etching may be between about 5 sec and about 300 sec, such as about 100 sec. In order to form the shallow recesses 1101 in accordance with some embodiments, the ILD layer 113 may be recessed from the initial overall first height H1 to a first recess depth RD1 of between about 1 nm and about 20 nm, such as about 5 nm and the CMG refill plugs 1001 may be recessed from the initial overall first height H1 to a second recess depth RD2 of between about 1 nm and about 20 nm, such as about 10 nm. However, any suitable depths may be used for the first recess depth RD1 of the ILD layer 113 and for the second recess depth RD2 of the CMG refill plugs 1001.

According to some embodiments, the CMG shallow recess etching process comprises a wet etch by dipping the top surface of the CMG refill 1001 into an etchant such as HF, although other etchants, such as $H_2$, and other methods, such as a reactive ion etch, a dry etch with etchants such as $NH_3/NF_3$, chemical oxide removal, or dry chemical clean may be performed using chlorine-containing or fluorine-containing gases, such as $Cl_2$, $NF_3$, $SiCl_4$, $BCl_3$, $O_2$, $N_2$, $H_2$, Ar, combinations thereof or the like. However, any suitable dry etching gases may be used for the CMG shallow recess etching process.

Figure 12:
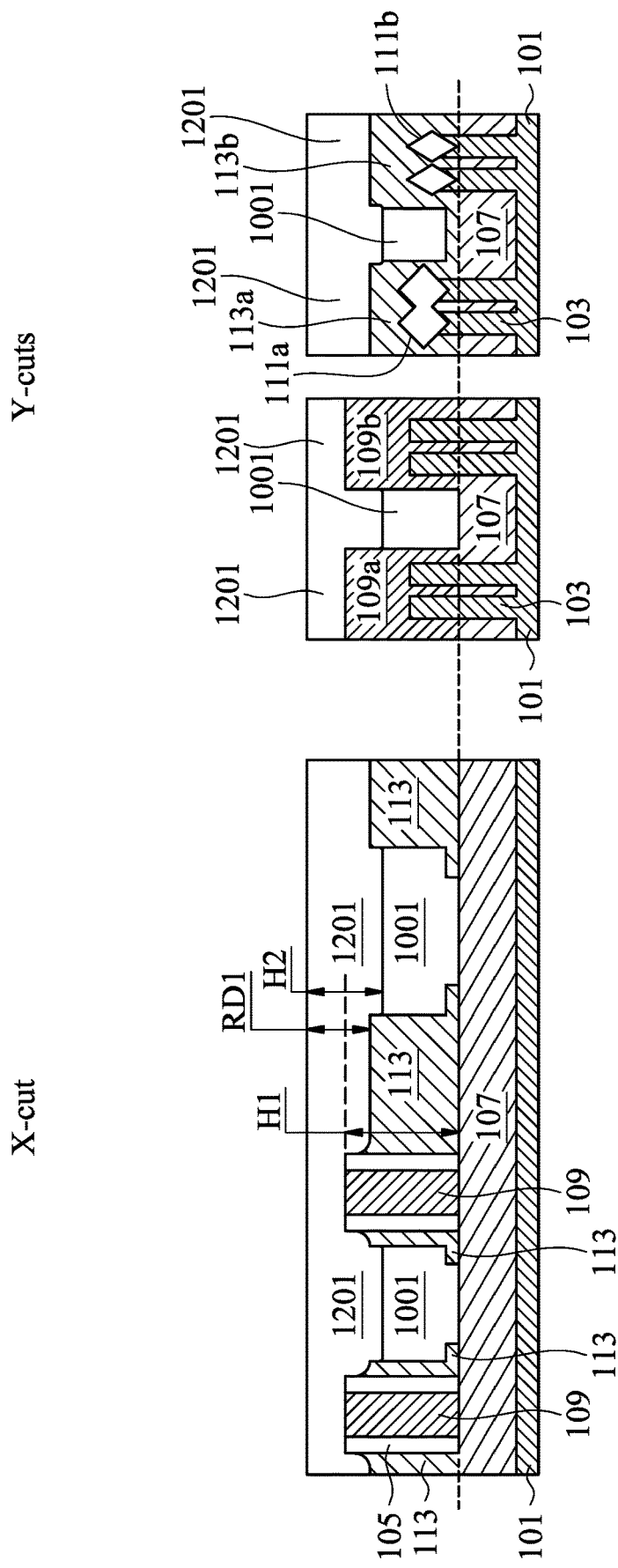
FIG. 12 illustrates a re-fill process in accordance with some embodiments.

FIG. 12 illustrates the formation of a second CMG refill material 1201. Once the shallow recesses 1101 have been formed in the ILD layer 113 and the CMG refill plugs 1001, the second CMG refill material 1201 may be blanket deposited over the ILD layer 113 to over-fill the shallow recesses 1101 to an overall second height H2 and to conformally blanket cover the exposed surfaces of ILD layer 113, the exposed surfaces of the CMG refill plugs 1001, the exposed surfaces of the spacers 105 and the exposed surfaces of the metal gates 109. The second CMG refill material 1201 may be a dielectric material such as silicon oxycarbide (SiOC) or silicon oxycarbonitride (SiOCN), wherein carbon is between about 1% and 10% of the compound by weight and/or wherein nitrogen is less than about 20% of the compound by weight, and may be represented by the formulas $(SiO)_{(1-x)}C_x$, and/or $(SiO)_{(1-x-y)}C_xN_y$, wherein x=0.01-0.1 and y<0.2 and wherein the second CMG refill material 1201 is a different dielectric material and is a harder material than the first CMG refill material 901 of the CMG refill plugs 1001. In an embodiment, the second CMG refill material 1201 is formed to an overall second height H2 above the recessed surface of the CMG refill plugs 1001. According to some embodiments, the overall second height H2 is between about 11 nm and about 50 nm, such as about 20 nm.

Figure 13:
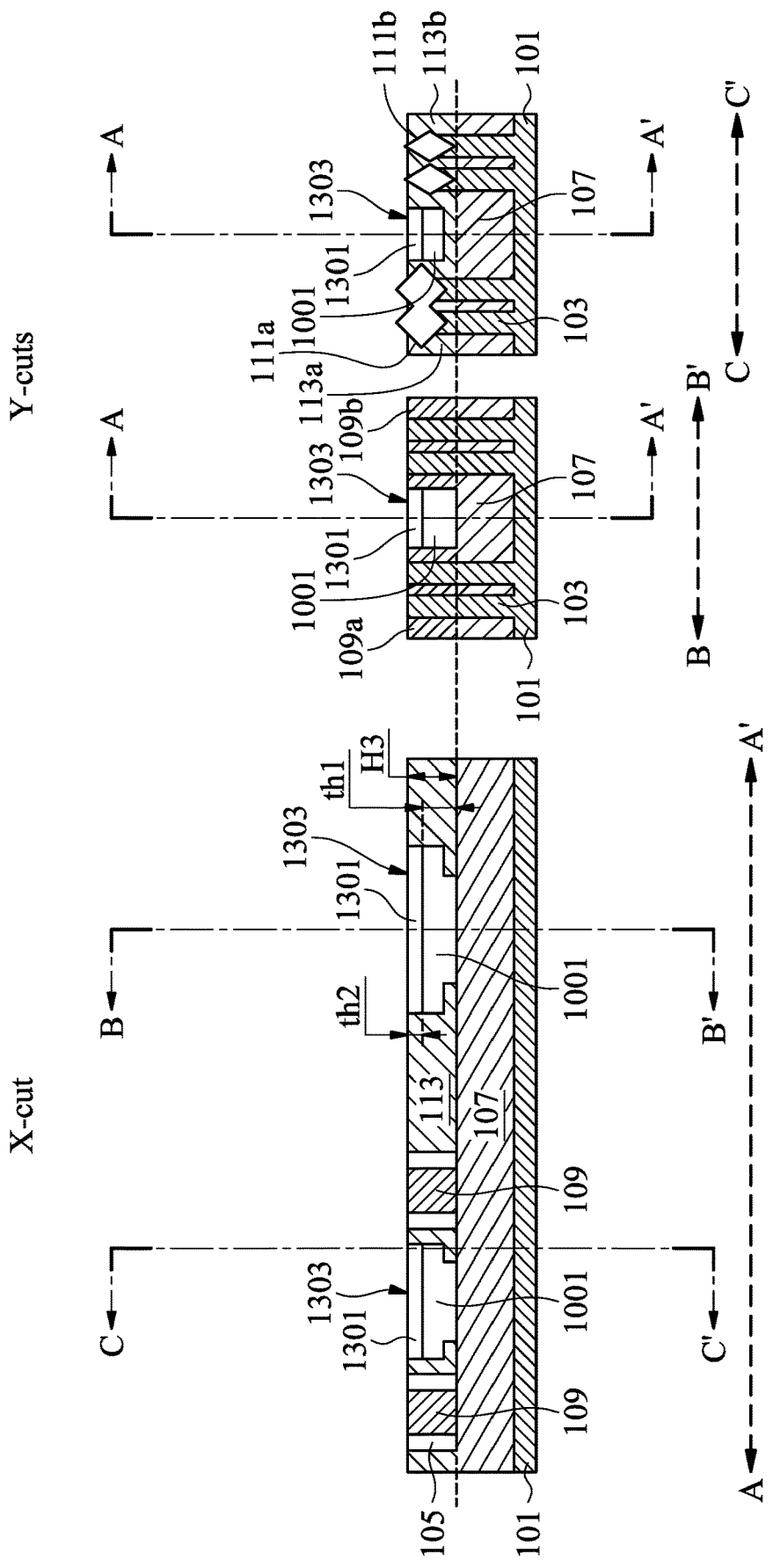
FIG. 13 illustrates a planarization process in accordance with some embodiments.

Referring to FIG. 13, this figure illustrates forming a plurality of isolation regions 1303 in the ILD layer 113. Once deposited, the second CMG refill material 1201 is planarized along with planarization of the ILD layer 113, the spacers 105 and the metal gates 109 to form the plurality of isolation regions 1303. In some embodiments, the planarization may be performed using, for example, a chemical mechanical (CMP) process to remove the excess materials of the second CMG refill material 1201 along with excess materials of the metal gates 109, the excess materials of the spacers 105 and the excess materials of the ILD layer 113. The CMP planarization process may continue until surfaces of the second CMG refill material 1201, surfaces of the spacers 105, and surfaces of the metal gates 109, and until a planar surface of the ILD layer 113 have been reduced from the overall first height H1 to a third overall height H3 and until the surfaces of the spacers 105, surfaces of the metal gates 109 and surfaces of the second CMG refill material 1201 are exposed in the planar surface of the ILD layer 113. As such, a plurality of isolation regions 1303 is formed in the ILD layer 113. The isolation regions 1303 comprises a CMG refill plug 1001 formed from the first CMG material 901 and a CMG helmet 1301 formed over the CMG refill plug 1001 from the second CMG material 1201.

In some embodiments, once planarized, the height of the planarized ILD layer 113, the heights of the metal gates 109, the heights of the spacers 105, and the heights of the second CMG refill material 1201 may be reduced to the overall third height H3 of between about 5 nm and about 50 nm, such as about 30 nm. According to some embodiments, the CMG refill plug 1001 portion of the isolation region 1303 is formed to between about 50% and about 99% of the overall height of the isolation region 1303 and the CMG helmet 1301 portion of the isolation region 1303 is formed to between about 50% and about 1% of the overall height of the isolation region 1303. For example, the CMG refill plug 1001 may be formed to a first thickness Th1 of between about 5 nm and about 45 nm, such as about 30 nm and the CMG helmet 1301 may be formed to a second thickness Th2 of between about 1 nm and about 30 nm, such as about 20 nm. However, any suitable heights and any suitable thicknesses may be used for the third overall height H3, the first thickness Th1 and the second thickness Th2.

FIG. 13 further illustrates the plurality of isolation regions 1303 formed in the ILD layer 113 of the related X-cut and Y-cut views. The isolation regions 1303 extend between adjacent gates of the metal gates 109 formed in the ILD layer 113 of the X-cut view in a direction of the cutline A-A' with the CMG helmet portions 1301 being exposed in a planar surface of the ILD layer 113 along with the exposed portions of the metal gates 109. In the first Y-cut view, the isolation region 1303 extends through the cutline B-B' and separates the first section 109a of the metal gate 109 from the second section 109b of the metal gate 109. In addition, the CMG helmet portion 1301 is exposed with surfaces of the first section 109a and the second section 109b in the planar surface of the ILD layer 113. In the second Y-cut view, the isolation region 1303 extends through the cutline C-C' and separates a first source/drain region 111a from the source/drain region 111b. In addition, the CMG helmet portion 1301 of the isolation region 1303 in the second Y-cut view is exposed with surfaces of the first section 109a and the second section 109b in the planar surface of the ILD layer 113.

Figure 14:
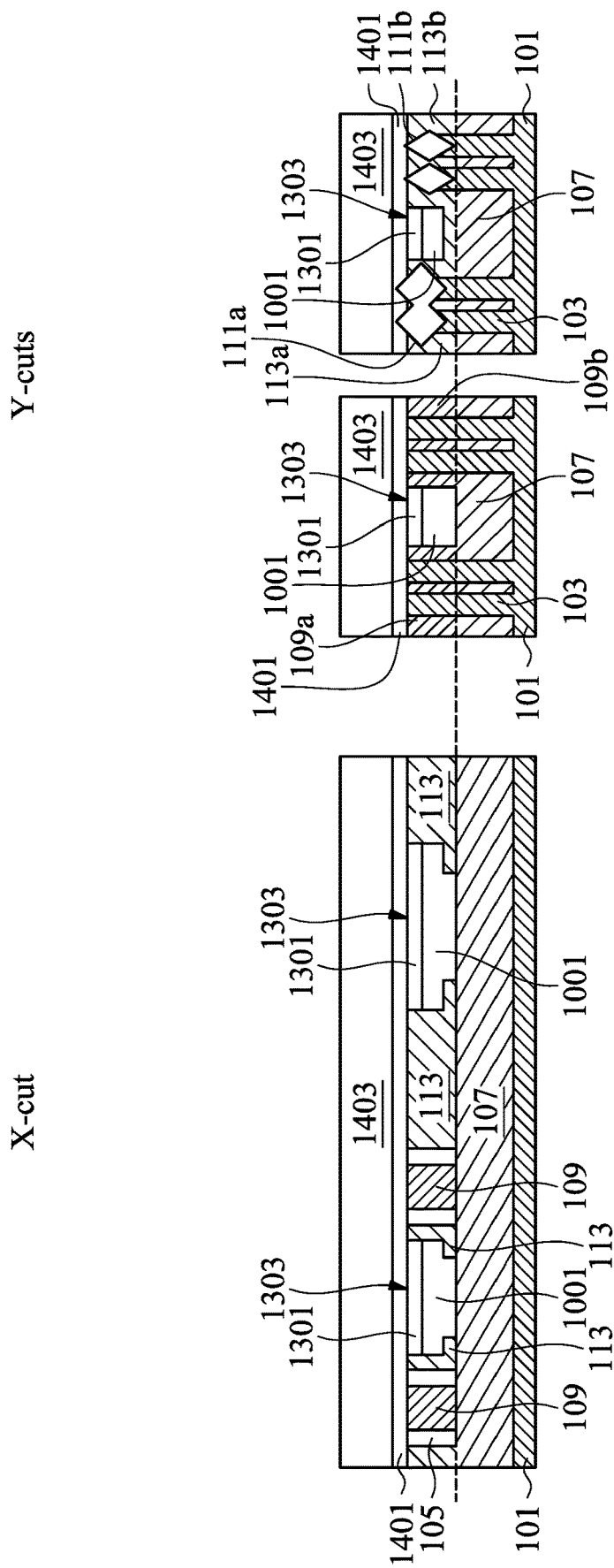
FIG. 14 illustrates a deposition process in accordance with some embodiments.

Turning to FIG. 14, once the isolation region 1303 have been formed and the CMG helmet portions 1301 are exposed in the planar surface of the ILD layer 113, a second series of hard mask layers may be formed over the planarized surfaces of the ILD layer 113, the exposed portions of the metal gates 109, the exposed portions of the spacers 105 and the exposed portions of the CMG helmet portions 1301.

In some embodiments, a first layer in the second series of masking layers may be a contact etch stop layer (CESL) 1401. The contact etch stop layer 1401 may be formed as a blanket deposit layer of a material such as Si, TiN, SiN, $SiO_2$, combinations thereof, or the like using a deposition method such as atomic layer deposition (ALD), plasma enhanced chemical vapor deposition (PECVD), chemical vapor deposition (CVD), or the like. However, any suitable materials and any suitable methods may be used to form the contact etch stop layer 1401. In some embodiments, the contact etch stop layer 1401 may be formed to a thickness of between about 10 Å and about 200 Å, such as about 50 Å. However, any suitable thickness may be used for the contact etch stop layer 1401 of the second series of hard masking layers.

A hard mask layer 1403 may be deposited over the contact etch stop layer (CESL) 1401 as a second layer of the second series of masking layers. The hard mask layer 1403 is formed over the contact etch stop layer 1401 from a second hard mask material such as Si, $SiO_2$, SiN, compounds thereof, or the like. The second hard mask material used to form the hard mask layer 1403 is different from the first hard mask material used to form the contact etch stop layer 1401. As such, the contact etch stop layer 1401 may serve as an etch stop of a subsequent patterning of the hard mask layer 1403 of the second series of hard masking layers. According to some embodiments, the hard mask layer 1403 in the second series of hard masking layers may be placed over the contact etch stop layer 1401 using a deposition method such as atomic layer deposition (ALD), plasma enhanced chemical vapor deposition (PECVD), chemical vapor deposition (CVD), or the like. However, any suitable materials and any suitable methods may be used to form the hard mask layer 1403. In some embodiments, the hard mask layer 1403 may be formed to a thickness of between about 10 Å and about 500 Å, such as about 100 Å. However, any suitable thickness may be used for hard mask layer 1403 in the second series of hard masking layers.

Figure 15A:
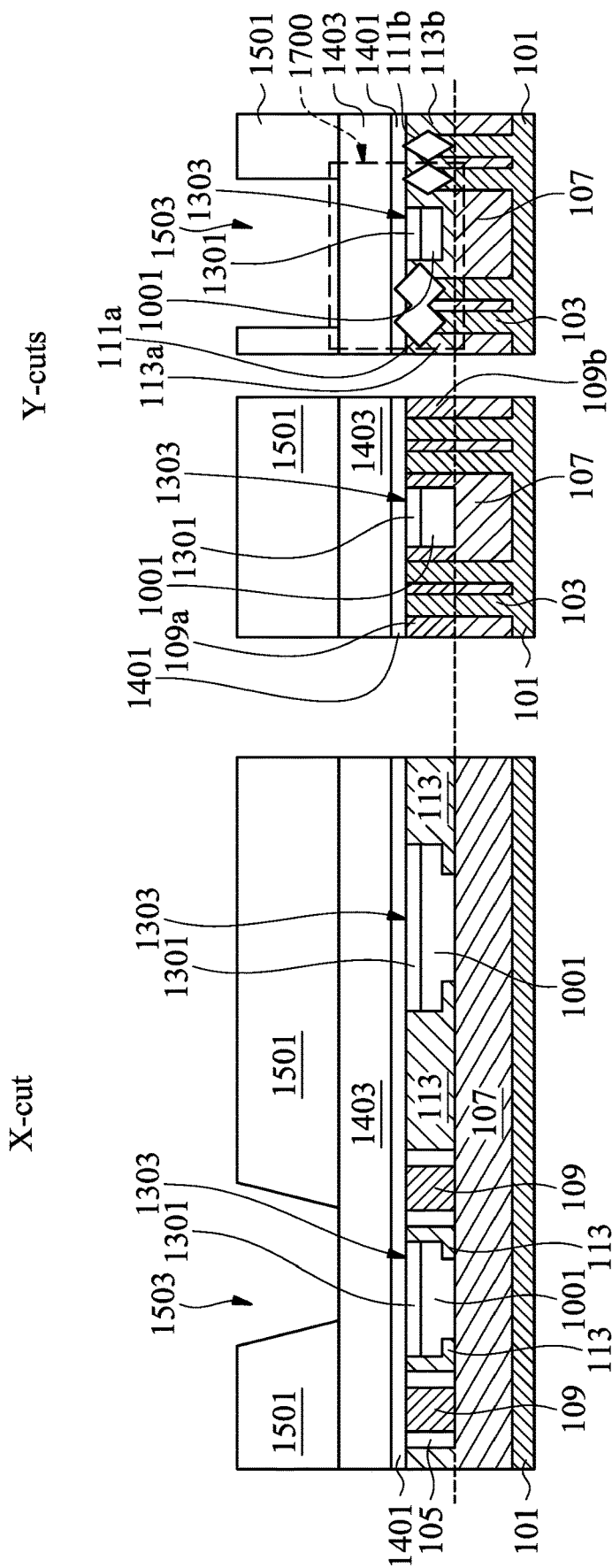
FIGS. 15A-15B illustrates a photolithography process in accordance with some embodiments.

FIG. 15A illustrates a photolithography process for depositing and patterning a photo resist layer 1501 for forming openings 1503 through the second hard mask layer 1403 in the second series of hard masking layers. According to embodiments, the photo resist layer 1501 may be deposited over the second hard mask layer 1403 as a third layer of the second series of masking layers. The photo resist layer 1501 may be deposited using any suitable deposition process, may be formed to any suitable thickness, and may be patterned using any suitable photolithography method to form the openings 1503 through the photo resist layer 1501 and to expose surfaces of the second hard mask layer 1403 of the second series of hard masking layers in areas overlying one or more of the isolation regions 1303. In some embodiments, the photo resist layer 1501 is applied and patterned such that some of the isolation regions 1303 remain covered while the others of the isolation regions 1303 are exposed through the openings 1503 of the photo resist layer 1501. FIG. 15A also illustrates a section 1700 with a dashed outline highlighting a portion of the second "Y-cut" below the openings 1503 formed in the photo resist layer 1501. Section 1700 and the structures highlighted therein are discussed in greater detail below.

Figure 15B:
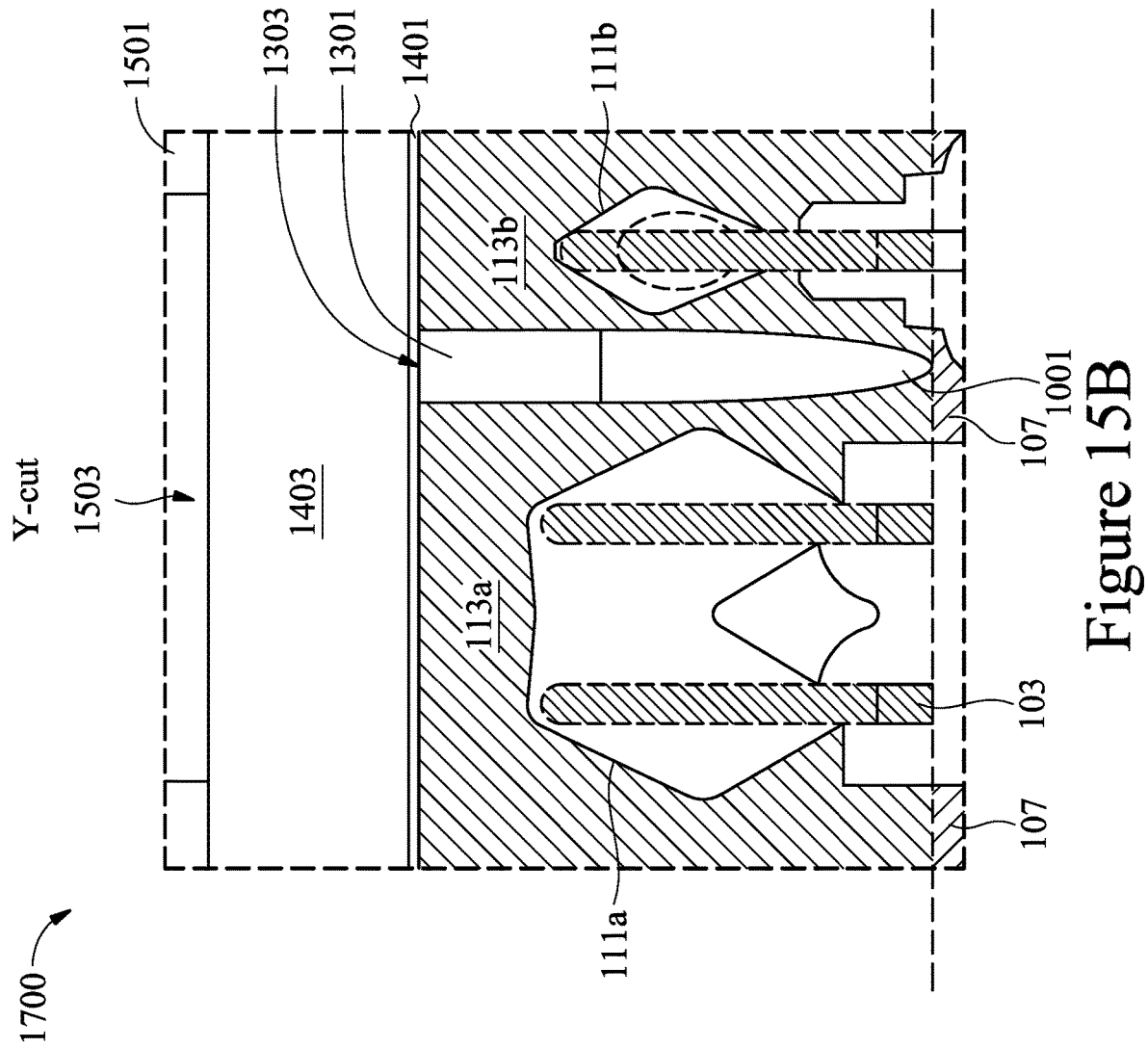

FIG. 15B illustrates, in greater detail, the section 1700 of the second "Y-cut" view illustrated in FIG. 15A in accordance with some embodiments. FIG. 15B further illustrates an example of the patterned photo resist layer 1501 with openings 1503 surfaces of the second hard mask layer 1403 exposed through the openings 1503. In addition, FIG. 15B illustrates an embodiment of the isolation structures 1303 and the other structures embedded in the first and second ILD sections (113a, 113b), prior to forming openings 1603 through the second series of hard masking layers (1403, 1401) and into the ILD layer 113. In some embodiments, the isolation structures 1303 may be formed with a CMG plug 1001 and a CMG helmet 1301.

Figure 16:
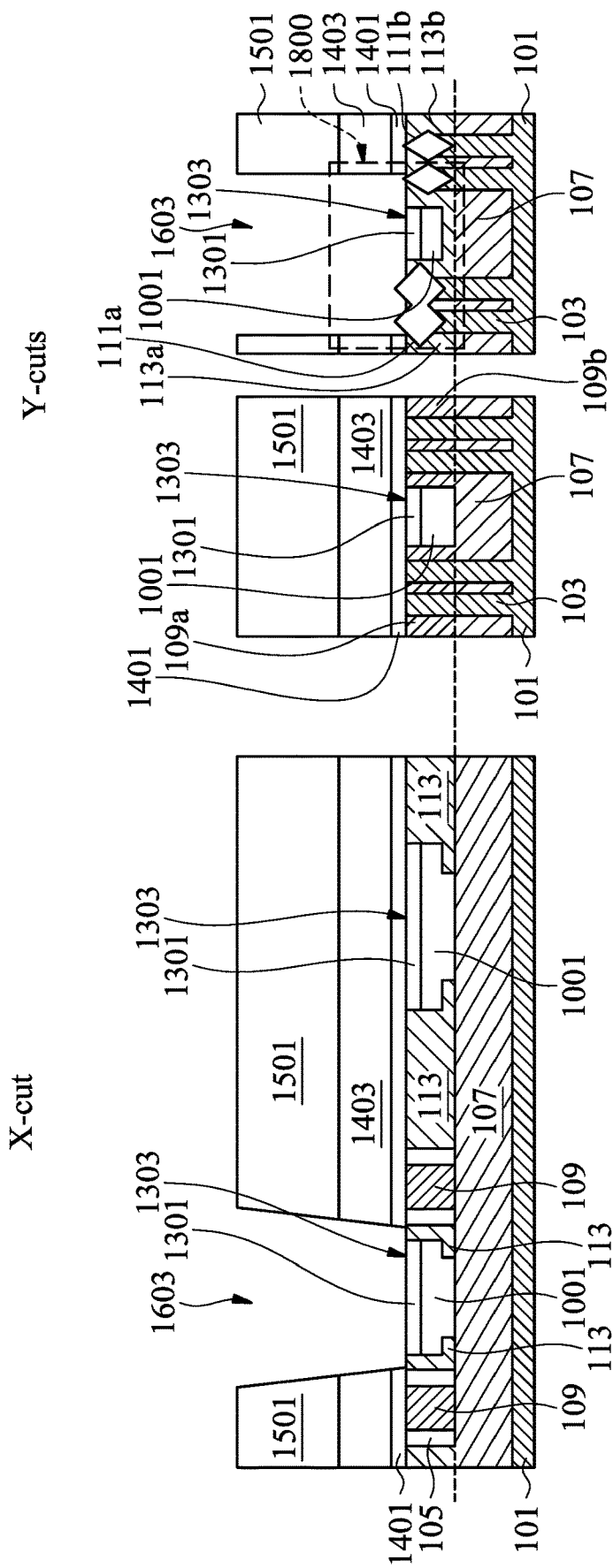
FIG. 16 illustrates a removal process for forming a contact opening in accordance with some embodiments.

FIG. 16 illustrates forming openings 1603 through the second series of hard masking layers using the patterned photo resist layer 1501. In some embodiments, photo resist layer 1501 may be removed prior to etching the ILD layer 113 using the second series of hard masking layers as the mask. In other embodiments, the photo resist layer 1501 is removed after etching the ILD layer 113. The patterned second series of hard masking layers is used to etch into the ILD layer 113 to expose surfaces of the CMG helmet portions 1301 and to expose surfaces of the epitaxial portions of the first and second source/drain regions (111a, 111b) within the openings 1603 for further processing and forming metal contacts for the first and second source/drain regions (111a, 111b). According to some embodiments, the etching process used to form the openings 1603 and to etch into the ILD layer 113 may be performed to remove the materials of the first and second layers of the second series of hard mask layers (1401, 1403) and into the ILD layer 113 using, for example, carbon-and-fluorine-containing gases such as $CF_4$, $CH_2F_2$, $CHF_3$, or the like. However, any suitable gasses may be used.

According to embodiments disclosed herein, the etching of the ILD layer 113 is performed using a timed etching process, referred herein as an EPI etch process. In the EPI etch process, the timed etching process simultaneously etches the materials of the first and second sections (113a, 113b) of the ILD layer 113 with a first EPI etch rate (Eer1) and etches the materials of the CMG helmet portions 1301 with a second EPI etch rate (Eer2). According to some embodiments, the EPI etch process may have a second EPI etch rate (Eer2) that is slower than the first EPI etch rate (Eer1). In other words, the EPI etch process has an etch ratio (ERatioEPI)=Eer1/Eer2 that is greater than or equal to 1 (i.e., ERatioEPI>=1). As such, the materials of the ILD layer 113 are removed at a greater rate than the rate of removal of the materials of the CMG helmet portions 1301.

According to some embodiments, the EPI etch process has an etch ratio (ERatioEPI) of the ILD layer 113 to the CMG helmet portions 1301 of between about 10:8 and about 100:1, such as about 20:1 and the time of etching may be between about 5 sec and about 300 sec, such as about 50 sec. However, any suitable ratio may be used for the EPI etch ratio (ERatioEPI) of the timed etching process. According to some embodiments, the first EPI etch rate (Eer1) of the ILD layer 113 may be between about 2 Å/sec and about 100 Å/sec, such as about 10 Å/sec and the second EPI etch rate (Eer2) of the CMG helmet portions 1301 may be between about 1 Å/sec and about 80 Å/sec, such as about 8 Å/sec. However, any suitable etch rates may be used for the first EPI etch rate (Eer1) and the second EPI etch rate (Eer2).

In some embodiments, the etching ratio ER1 of ILD/CMG materials for the shallow recess etch may be between about 0:1 and about 1:1, such as about 1:1 and the time of etching may be between about 5 sec and about 300 sec, such as about 50 sec. In order to form the shallow recesses in accordance with some embodiments, the ILD layer 113 may be recessed to a first recess depth of between about 1 nm and about 20 nm, such as about 20 nm and the CMG helmet portions 1301 may be recessed to a second recess depth of between about 1 nm and about 20 nm, such as about 3 nm, or less than about 25% of the helmet structure. However, any suitable depths may be used.

FIG. 16 also illustrates a section 1800 with a dashed outline highlighting a portion of the second "Y-cut" below the openings 1603 exposing surfaces of the first and second EPI regions (111a, 111b) and the CMG helmet portions 1301 in the first and second sections (113a, 113b) of the ILD layer 113. Section 1800 and the structures highlighted therein are discussed in greater detail below.

FIG. 17 illustrates section 1800, in greater detail, the etching process for forming the openings 1603 over the source/drain region of the "Y-cut" illustrated in FIG. 16 in accordance with some embodiments. FIG. 15B further illustrates an example of the patterned photo resist layer 1501 with openings 1503 surfaces of the second hard mask layer 1403 exposed through the openings 1503. In addition, FIG. 17 illustrates an embodiment of the isolation structures 1303 and the other structures embedded in the first and second ILD sections (113a, 113b), after forming the openings 1603 into the ILD layer 113. During the ILD etch process, some of the material of the CMG helmet 1301 may be removed; as such, the height of the CMG helmet 1301 may be reduced to a final helmet height HH of between about 0 nm and about 5 nm, such as about 2 nm while the ILD layer 113 adjacent to the CMG plug 1001 is reduced to final height ILDH of between about 1 nm and about 50 nm, such as about 30 nm.

When the CMG protective helmet structure is formed as the top portion of the CMG dummy gate plug, there is no need to perform a residue clean after the contact etching is performed because minimal residue to no residue is formed from the refill material of the dummy CMG contact plug. As such, the resulting CMG device will have improved AC current performance because little to no residue collects on the surface of the EPI during the contact etching process which allows for a strong surface to surface contact between the surface of the EPI and a subsequently formed contact structure that is formed over the EPI. Furthermore, the resulting CMG device will have good Ceff performance because the CMG re-fill is not damaged during the contact etching process and little to no refill material of the dummy CMG contact plug is lost which allows for the construction of a conductive CMG plug with the desired size and dimensions to be subsequently formed within the area of the dummy CMG contact plug.

Optionally, in some embodiments, if a residue clean is still desired, a weaker solution which imparts more minimal damage to the EPI surface may be utilized. For example, a weak solution such as deionized (DI) water, $SC_1/SC_2$, Ozone, or the like may be utilized to remove any undesirable residue. By utilizing a weaker solution, a little to no damage occurs to the EPI and the benefits discussed above can still be obtained.

Once the openings 1603 have been formed, a first contact 1605 may be formed in electrical connection with the S/D regions 111. Optionally, prior to formation of first contact 1605, a silicide contact may be formed. The silicide contact may comprise titanium, nickel, cobalt, or erbium in order to reduce a Schottky barrier height of the contact; however, other metals, such as platinum, palladium, or the like, may also be used. The silicidation may be performed by blanket deposition of an appropriate metal layer, followed by an annealing step which causes the metal to react with underlying exposed silicon. Un-reacted metal is then removed, such as with a selective etch process. The thickness of the silicide contact may be between about 5 nm and about 50 nm.

In a representative embodiment, first contact 1605 may comprise a conductive material such as Ti, W, TiAlN, TaC, TaCN, TaSiN, Mn, Zr, TiN, TaN, Ru, Mo, or WN, although any suitable material, such as aluminum, copper, alloys of these, combinations of these, or the like may be used. Conductive material may be deposited into the opening using a deposition process such as sputtering, chemical vapor deposition (CVD), electroplating, electroless plating, or the like, to fill and/or overfill opening. Once filled (or overfilled), any material deposited outside of the opening may be removed using a planarization process such as chemical mechanical polishing (CMP); however, any suitable material removal process may be utilized.

In accordance with an embodiment, a method includes: forming an opening in a cut metal gate region of a semiconductor device; depositing a first refill material in the opening to form a cut metal gate plug; performing a chemical mechanical polishing to expose a metal gate structure; etching the first refill material to form a recess in the cut metal gate plug; filling the recess with a second refill material to form a helmet structure over the first refill material of the cut metal gate plug; and forming contacts to source/drain regions of adjacent devices that are separated by the cut metal gate plug. In an embodiment the forming the contacts further includes: etching an interlayer dielectric material in the source/drain regions at a first etch rate; and etching the helmet structure at a second etch rate such that contact openings are formed over and expose upper surfaces of epitaxial source/drain regions of the adjacent devices, the second etch rate being different from the first etch rate. In an embodiment an etch ratio of an etch rate of the interlayer dielectric material to an etch rate of the second refill material of the helmet structure is greater than 1:1. In an embodiment the etch ratio is greater than 20:1. In an embodiment the etching the helmet structure comprises removing less than 25% of the helmet structure. In an embodiment the etching the first refill material to form a recess in the cut metal gate plug further includes: etching the interlayer dielectric material at a first etch rate to a first depth; and etching the first refill material at a second etch rate to a second depth, the second etch rate being greater than the first etch rate and the second depth being greater than the first depth. In an embodiment an etch ratio of the first etch rate of the interlayer dielectric material to the second etch rate of the first refill material is less than 1:1.

In accordance with another embodiment, a method includes: forming a first metal gate over a first semiconductor fin; forming a first opening through the first metal gate; filling the first opening with a first dielectric material; planarizing the first dielectric material with the first metal gate; recessing the first dielectric material to form a second opening; filling the second opening with a second dielectric material; and planarizing the second dielectric material with the first metal gate. In an embodiment the method further includes: growing a first epitaxial source/drain region on the first semiconductor fin; forming the first opening through a first section of an interlayer dielectric (ILD) layer around the first epitaxial source/drain region, wherein the planarizing the second dielectric material with the first metal gate includes planarizing the first section of the ILD layer with the first metal gate; and etching the first section of the ILD layer to expose the first epitaxial source/drain region and to remove at least a portion of a material of the ILD layer between the first epitaxial source/drain region and the second dielectric material within the first section of the ILD layer. In an embodiment the second dielectric material has a hardness that is greater than a hardness of the first dielectric material. In an embodiment the etching the first section of the ILD layer further comprises using a timed etching process with a first etch rate for a material of the ILD layer and with a second etch rate for the second dielectric material, the second etch rate being slower than the first etch rate. In an embodiment the second etch rate is at least two times slower than the first etch rate. In an embodiment the second etch rate is at least 20 times slower than the first etch rate. In an embodiment the etching the first section of the ILD layer further comprises removing less than 25% of the second dielectric material within the first section of the ILD layer.

In accordance with yet another embodiment, a semiconductor device, includes: a plurality of metal gate structures disposed in an interlayer dielectric (ILD) layer disposed on a substrate; and an isolation structure disposed between the metal gate structures, the isolation structure comprising a dielectric helmet portion disposed over a dielectric plug portion, wherein the isolation structure is at least partially embedded in the ILD layer and electrically isolates and physically separates a source/drain of a first device from a source/drain of a second device within the ILD layer. In an embodiment the dielectric helmet portion comprises a first material that is different from a second material of the dielectric plug portion. In an embodiment an interface between the dielectric helmet portion and the dielectric plug portion of the isolation structure is disposed below an upper surface of an epitaxial region covered by the source/drain contact of the first device. In an embodiment a planar surface of the dielectric helmet portion is disposed in a planar surface of the ILD layer. In an embodiment the first material has a hardness that is greater than a hardness of the second material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming an opening in a cut metal gate region of a semiconductor device, wherein after the forming the opening the opening has sidewalls comprising a conductive material;
    depositing a first refill material in the opening to form a cut metal gate plug;
    performing a chemical mechanical polishing to expose a metal gate structure;
    etching the first refill material to form a recess in the cut metal gate plug;
    filling the recess with a second refill material to form a helmet structure over the first refill material of the cut metal gate plug; and
    forming contacts to source/drain regions of adjacent devices that are separated by the cut metal gate plug, wherein the forming the contacts further comprises:
        etching an interlayer dielectric material in the source/drain regions at a first etch rate; and
        etching the helmet structure at a second etch rate such that contact openings are formed over and expose upper surfaces of epitaxial source/drain regions of the adjacent devices, the second etch rate being different from the first etch rate.

2. The method of claim 1, wherein an etch ratio of an etch rate of the interlayer dielectric material to an etch rate of the second refill material of the helmet structure is greater than 1:1.

3. The method of claim 2, wherein the etch ratio is greater than 20:1.

4. The method of claim 1, wherein the etching the helmet structure comprises removing less than 25% of the helmet structure.

5. The method of claim 2, wherein the etching the first refill material to form a recess in the cut metal gate plug further comprises:
    etching the interlayer dielectric material at a first etch rate to a first depth; and
    etching the first refill material at a second etch rate to a second depth, the second etch rate being greater than the first etch rate and the second depth being greater than the first depth.

6. The method of claim 5, wherein an etch ratio of the first etch rate of the interlayer dielectric material to the second etch rate of the first refill material is less than 1:1.

7. A method comprising:
    forming a first metal gate over a first semiconductor fin;
    forming a first opening through the first metal gate, wherein the forming the first opening removes material of the first metal gate;
    filling the first opening with a first dielectric material;
    planarizing the first dielectric material with the first metal gate;
    recessing the first dielectric material to form a second opening;
    filling the second opening with a second dielectric material; and
    planarizing the second dielectric material with the first metal gate.

8. The method of claim 7, further comprising:
    growing a first epitaxial source/drain region on the first semiconductor fin;
    forming the first opening through a first section of an interlayer dielectric (ILD) layer around the first epitaxial source/drain region, wherein the planarizing the second dielectric material with the first metal gate includes planarizing the first section of the ILD layer with the first metal gate; and
    etching the first section of the ILD layer to expose the first epitaxial source/drain region and to remove at least a portion of a material of the ILD layer between the first epitaxial source/drain region and the second dielectric material within the first section of the ILD layer.

9. The method of claim 7, wherein the second dielectric material has a hardness that is greater than a hardness of the first dielectric material.

10. The method of claim 8, wherein the etching the first section of the ILD layer further comprises using a timed etching process with a first etch rate for a material of the ILD layer and with a second etch rate for the second dielectric material, the second etch rate being slower than the first etch rate.

11. The method of claim 10, wherein the second etch rate is at least two times slower than the first etch rate.

12. The method of claim 10, wherein the second etch rate is at least 20 times slower than the first etch rate.

13. The method of claim 8, wherein the etching the first section of the ILD layer further comprises removing less than 25% of the second dielectric material within the first section of the ILD layer.

14. The method of claim 8, wherein the recessing the first dielectric material to form a second opening further comprises using a timed etch process to recess the first dielectric material and using the timed etch process to recess a second section of the ILD layer that separates the first dielectric material from another metal gate, wherein the timed etch process recesses the first dielectric material at least 10 times faster than the recessing of the second section of the ILD layer.

15. A method of manufacturing a semiconductor device, the method comprising:

forming a plurality of metal gate structures disposed in an interlayer dielectric (ILD) layer disposed on a substrate; and forming an isolation structure disposed between and in physical contact with the metal gate structures, the isolation structure comprising a dielectric helmet portion disposed over a dielectric plug portion, wherein the isolation structure is at least partially embedded in the ILD layer and electrically isolates and physically separates a source/drain of a first device from a source/drain of a second device within the ILD layer, wherein an interface between the dielectric helmet portion and the dielectric plug portion of the isolation structure is disposed below an upper surface of an epitaxial region covered by a source/drain contact of the first device.

16. The method of claim 15, wherein the dielectric helmet portion comprises a first material that is different from a second material of the dielectric plug portion.

17. The method of claim 16, wherein the first material has a hardness that is greater than a hardness of the second material.

18. The method of claim 15, wherein the forming the isolation structure forms a planar surface of the dielectric helmet portion disposed in a planar surface of the ILD layer.

19. The method of claim 15, wherein the forming the isolation structure recesses the dielectric plug portion.

20. The method of claim 15, further comprises forming contacts to source/drain regions of adjacent devices that are separated by the isolation structure.

* * * * *